United States Patent
Goto et al.

(10) Patent No.: US 12,497,469 B2
(45) Date of Patent: Dec. 16, 2025

(54) COMPOSITION FOR FORMING PATTERN, KIT, PATTERN PRODUCING METHOD, PATTERN, AND METHOD FOR MANUFACTURING SEMICONDUCTOR ELEMENT

(71) Applicant: FUJIFILM Corporation, Tokyo (JP)

(72) Inventors: Yuichiro Goto, Shizuoka (JP); Naoya Shimoju, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 936 days.

(21) Appl. No.: 17/476,481

(22) Filed: Sep. 16, 2021

(65) Prior Publication Data
US 2022/0002450 A1 Jan. 6, 2022

Related U.S. Application Data

(63) Continuation of application No. PCT/JP2020/011328, filed on Mar. 16, 2020.

(30) Foreign Application Priority Data

Mar. 22, 2019 (JP) ................................. 2019-054557

(51) Int. Cl.
*C08F 20/10* (2006.01)
*G03F 7/00* (2006.01)
*H01L 21/306* (2006.01)
*H01L 21/3213* (2006.01)

(52) U.S. Cl.
CPC ............ *C08F 20/10* (2013.01); *G03F 7/0002* (2013.01); *H01L 21/30604* (2013.01); *H01L 21/32139* (2013.01)

(58) Field of Classification Search
CPC .................................................... G03F 7/0002
See application file for complete search history.

(56) References Cited

U.S. PATENT DOCUMENTS

| | | |
|---|---|---|
| 8,076,386 B2 | 12/2011 | Xu et al. |
| 10,850,302 B2 | 12/2020 | Ito et al. |
| 2015/0064909 A1 | 3/2015 | Yamashita et al. |
| 2018/0037688 A1* | 2/2018 | Goto ................ C08F 222/10 |

FOREIGN PATENT DOCUMENTS

| | | |
|---|---|---|
| CN | 103076719 | 5/2013 |
| CN | 103076719 A * | 5/2013 |
| CN | 104220224 | 12/2014 |
| JP | 2007069301 | 3/2007 |
| JP | 2007523249 | 8/2007 |
| JP | 2011187824 | 9/2011 |
| JP | 2014146812 | 8/2014 |
| JP | 2015112781 | 6/2015 |
| JP | 2016164961 | 9/2016 |
| JP | 2017073512 | 4/2017 |
| WO | 2013154112 | 10/2013 |
| WO | 2016152597 | 9/2016 |

OTHER PUBLICATIONS

English translation of CN103076719. (Year: 2013).*
"Office Action of Taiwan Counterpart Application", issued on Jul. 19, 2023, with partial English translation thereof, p. 1-p. 15.
Office Action of Japan Counterpart Application, with English translation thereof, issued on Aug. 23, 2022, pp. 1-6.
"International Search Report (Form PCT/ISA/210) of PCT/JP2020/011328," mailed on May 26, 2020, with English translation thereof, pp. 1-6.
"Written Opinion of the International Searching Authority (Form PCT/ISA/237)" of PCT/JP2020/011328, mailed on May 26, 2020, with English translation thereof, pp. 1-7.

* cited by examiner

*Primary Examiner* — Mark F. Huff
*Assistant Examiner* — Anna Malloy
(74) *Attorney, Agent, or Firm* — JCIPRNET

(57) ABSTRACT

A composition for forming a pattern for imprinting, which contains a polymerizable compound, a photopolymerization initiator, and an organic halogen compound containing at least one atom selected from the group consisting of a chlorine atom, a bromine atom, and an iodine atom, in which the organic halogen compound is a compound which is stable to light of a mercury lamp, and a content of the organic halogen compound is 0.001% to 1.0% by mass with respect to a total solid content in the composition for forming a pattern; a kit including the composition for forming a pattern; a pattern producing method; a pattern; and a method for manufacturing a semiconductor element.

15 Claims, No Drawings

COMPOSITION FOR FORMING PATTERN, KIT, PATTERN PRODUCING METHOD, PATTERN, AND METHOD FOR MANUFACTURING SEMICONDUCTOR ELEMENT

CROSS-REFERENCE TO RELATED APPLICATIONS

This application is a Continuation of PCT International Application No. PCT/JP2020/011328 filed on Mar. 16, 2020, which claims priority under 35 U.S.C § 119(a) to Japanese Patent Application No. 2019-054557 filed on Mar. 22, 2019. Each of the above application(s) is hereby expressly incorporated by reference, in its entirety, into the present application.

BACKGROUND OF THE INVENTION

1. Field of the Invention

The present invention relates to a composition for forming a pattern in an imprinting method, and further relates to a kit to which this composition is applied, a pattern producing method, a pattern, and a method for manufacturing a semiconductor element.

2. Description of the Related Art

An imprinting method is a technique in which a fine pattern is transferred to a plastic material by pressing a metal mold (generally also called a mold or a stamper) on which a pattern is formed. The imprinting method enables simple and precise production of a fine pattern, and thus is expected to be applied in various fields in recent years. In particular, a nanoimprint technique for forming a fine pattern of a nano-order level is attracting attention.

The imprinting method is roughly classified into a thermal imprinting method and an optical imprinting method according to a transfer method thereof. In the thermal imprinting method, a mold is pressed against a thermoplastic resin heated to a temperature equal to or higher than a glass transition temperature (hereinafter, referred to as a "Tg" in some cases), the thermoplastic resin is cooled, and then the mold is released to form a fine pattern. This method has an advantage that various materials can be selected, but also has problems in that a high pressure is required during pressing, and as the pattern size is finer, the dimensional accuracy is more likely to be reduced due to thermal shrinkage or the like. Meanwhile, in the optical imprinting method, after photocuring is performed in a state where a mold is pressed against a composition for forming a pattern, the mold is released. In this method, high-pressure application or high-temperature heating is not required, a dimensional change before and after curing is small, and thus there is an advantage that a fine pattern can be formed with high accuracy.

In the optical imprinting method, a composition for forming a pattern for imprinting is applied onto a substrate, and then a mold made of a light-transmitting material such as quartz is pressed. The composition for forming a pattern is cured by light irradiation in a state where the mold is pressed, and then the mold is released to produce a cured substance to which a desired pattern is transferred.

In the composition for forming a pattern for imprinting, due to an advantage such as a high reaction rate and the like, for example, a radically polymerizable compound is used (JP2007-523249A and WO2016/152597A). However, this radically polymerizable compound (in a representative example, a (meth)acrylate compound) also has a problem in that degeneration is more likely to occur with time. One of the main causes of the problem is known to be hydrolysis due to a reaction with moisture, and in order to improve temporal stability of the composition for forming a pattern, ideas such as adjusting a moisture content (JP2014-146812A), and putting a desiccant in a storage container for storing the composition for forming a pattern (JP2016-164961A) have been considered.

SUMMARY OF THE INVENTION

However, regardless of the kind of the polymerizable compound, in addition to the influence of moisture, a problem has been found that releasability of the mold is more likely to be degraded in a case where imprinting is performed by repeatedly using a mold. Therefore, a composition for forming a pattern which has excellent temporal stability, and with which the releasability of the mold can be sufficiently ensured even in a case where the mold is repeatedly used is desirable.

Moreover, in a case where the composition for forming a pattern is applied in the imprinting method, metal-made equipment such as an ink jet device may be used, and it is desirable that an influence (corrosion or the like) of the composition for forming a pattern on a metal is smaller.

The present invention has been made in consideration of the aforementioned problems, and an object of the present invention is to provide a composition for forming a pattern which has excellent temporal stability even in imprinting in which a mold is repeatedly used, and has a suppressed influence on a metal.

Moreover, another object of the present invention is to provide: a kit which is for imprinting and includes the composition for forming a pattern; a pattern producing method using the composition for forming a pattern; and a pattern formed of the composition for forming a pattern. Furthermore, still another object of the present invention is to provide a method for manufacturing a semiconductor element, which includes the pattern producing method as a step.

The aforementioned problems can be solved by adding a predetermined organic halogen compound in an amount in a predetermined range to the composition for forming a pattern for imprinting. Specifically, the aforementioned problems can be solved by the following unit <1> and preferably by a unit <2> and subsequent units.

<1>

A composition for forming a pattern for imprinting, comprising:
  a polymerizable compound;
  a photopolymerization initiator; and
  an organic halogen compound containing at least one atom selected from the group consisting of a chlorine atom, a bromine atom, and an iodine atom,
  in which the organic halogen compound is a compound which is stable to light of a mercury lamp, and
  a content of the organic halogen compound is 0.001% to 1.0% by mass with respect to a total solid content in the composition for forming a pattern.

<2>

The composition for forming a pattern as described in <1>, further comprising at least one halide ion selected from a chloride ion, a bromide ion, or an iodide ion, in which a total content of the halide ions is 0.05 to 1,000 ppm by mass with respect to the total solid content of the composition for forming a pattern.

<3>
The composition for forming a pattern as described in <1> or <2>, in which a molecular weight of the organic halogen compound is 130 to 550.

<4>
The composition for forming a pattern as described in any one of <1> to <3>, further comprising moisture in a proportion of 0.01% to 1.0% by mass with respect to the composition for forming a pattern.

<5>
The composition for forming a pattern as described in any one of <1> to <4>, in which the organic halogen compound contains a chlorine atom.

<6>
The composition for forming a pattern as described in any one of <1> to <5>, in which the at least one atom is bonded to an alkylene group in the organic halogen compound.

<7>
The composition for forming a pattern as described in <6>, in which the at least one atom is linked to a ring structure or an olefin structure via the alkylene group.

<8>
The composition for forming a pattern as described in any one of <1> to <7>, in which the organic halogen compound has a ring structure.

<9>
The composition for forming a pattern as described in <8>, in which a compound represented by Formula (D1) is contained as the organic halogen compound,

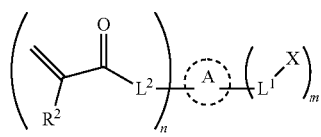

Formula (D1)

in Formula (D1), A represents a ring structure, $L^1$'s each independently represent a single bond or a divalent linking group connecting the ring structure A and X, X's each independently represent a chlorine atom, a bromine atom, or an iodine atom, m represents an integer of 1 to 4, $L^2$ represents a single bond or a divalent linking group connecting a carbon atom and the ring structure A, $R^2$ represents a hydrogen atom or a methyl group, and n represents an integer of 0 to 4.

<10>
The composition for forming a pattern as described in any one of <1> to <9>, in which the organic halogen compound has a polymerizable group.

<11>
The composition for forming a pattern as described in any one of <1> to <10>, in which the polymerizable compound contains a partial structure obtained by removing a halogen atom from the organic halogen compound.

<12>
The composition for forming a pattern as described in any one of <1> to <11>, in which the polymerizable compound has a (meth)acryloyl group.

<13>
The composition for forming a pattern as described in any one of <1> to <12>, in which a solvent other than water is not substantially contained.

<14>
The composition for forming a pattern as described in any one of <1> to <13>, further comprising a release agent having a hydrophilic group.

<15>
A kit comprising, as components of a combination:
the composition for forming a pattern as described in any one of <1> to <14>; and
a composition for forming an underlayer film, which is for forming an underlayer film for imprinting.

<16>
A pattern which is formed of the composition for forming a pattern as described in any one of <1> to <14>.

<17>
A pattern producing method comprising applying the composition for forming a pattern as described in any one of <1> to <14> onto a substrate or a mold and irradiating the composition for forming a pattern with light in a state of being sandwiched between the mold and the substrate.

<18>
A method for manufacturing a semiconductor element, comprising the producing method as described in <17> as a step.

<19>
The method for manufacturing a semiconductor element as described in <18>, further comprising performing etching using, as a mask, the pattern obtained by the producing method.

With the composition for forming a pattern for imprinting according to an aspect of the present invention, superior temporal stability is exhibited even in imprinting in which a mold is repeatedly used, and an influence on a metal is also suppressed. Moreover, with the composition for forming a pattern according to the aspect of the present invention, it is possible to provide the kit, the pattern producing method, the pattern, and the method for manufacturing a semiconductor element according to the aspect of the present invention.

DESCRIPTION OF THE PREFERRED EMBODIMENTS

Hereinafter, representative embodiments of the present invention will be described. Respective constituent elements will be described based on the representative embodiments for convenience, but the present invention is not limited to such embodiments.

In the present specification, a numerical range expressed using the term "to" means a range which includes the preceding and succeeding numerical values of "to" as a lower limit value and an upper limit value, respectively.

In the present specification, the term "step" is meant to include not only an independent step, but also a step which cannot be clearly distinguished from other steps as long as an intended action of the step is achieved.

In the description of a group (atomic group) in the present specification, in a case where the group is described without specifying whether the group is substituted or unsubstituted, the description means that the group includes both a group having no substituent and a group having a substituent. For example, in a case where a group is simply described as an "alkyl group", the description means that the alkyl group includes both an alkyl group having no substituent (unsubstituted alkyl group) and an alkyl group having a substituent (substituted alkyl group). Moreover, in a case where a group is simply described as an "alkyl group", the description means that the alkyl group may be chain-like or cyclic, and may be linear or branched in a case where the alkyl group is chain-like.

In the present specification, "light" includes not only light having a wavelength in an ultraviolet, near-ultraviolet, far-ultraviolet, visible, or infrared range, or an electromagnetic wave but also radiation. Examples of the radiation include a microwave, an electron beam, an extreme ultraviolet ray (EUV), and an X-ray. Moreover, laser light such as a 248-nm excimer laser, a 193-nm excimer laser, and a 172-nm excimer laser can also be used. The light may be monochromatic light (single-wavelength light) passing through an optical filter, or may be light (composite light) including a plurality of wavelengths.

In the present specification, "(meth)acrylate" means both "acrylate" and "methacrylate" or either of them, "(meth)acryl" means both "acryl" and "methacryl" or either of them, and "(meth)acryloyl" means both "acryloyl" or "methacryloyl" or either of them.

In the present specification, a solid content in a composition means components other than the solvent, and a content or a concentration of the total solid content in the composition is represented by the mass percentage of the components other than the solvent with respect to the total mass of the composition.

In the present specification, a temperature is 23° C. and an atmospheric pressure is 101,325 Pa (1 atm), unless otherwise specified.

In the present specification, a weight-average molecular weight (Mw) and a number-average molecular weight (Mn) are each expressed as a value in terms of polystyrene according to gel permeation chromatography (GPC measurement), unless otherwise specified. The weight-average molecular weight (Mw) and the number-average molecular weight (Mn) can be determined, for example, by using HLC-8220 (manufactured by TOSOH CORPORATION), and, as columns, GUARD COLUMN HZ-L, TSKgel Super HZM-M, TSKgel Super HZ4000, TSKgel Super HZ3000, and TSKgel Super HZ2000 (manufactured by TOSOH CORPORATION). Moreover, the measurement is performed using tetrahydrofuran (THF) as an eluent, unless otherwise specified. Furthermore, for the detection in the GPC measurement, a detector of ultraviolet rays (UV rays) having a wavelength of 254 nm is used, unless otherwise specified.

In the present specification, "imprint" preferably refers to transfer of a pattern with a size of 1 nm to 10 mm, and more preferably refers to transfer (nanoimprint) of a pattern with a size of about 10 nm to 100 μm.

In the present specification, regarding a positional relationship of respective layers constituting a laminate, in a case where there is a description of "upper" or "lower", another layer may be on an upper side or a lower side of a reference layer among a plurality of layers of interest. That is, a third layer or element may be further interposed between the reference layer and the other layer, and the reference layer and the other layer are not necessary to be in contact with each other. Moreover, unless otherwise specified, in a case where a direction in which layers are stacked on a substrate is referred to as "upward" or there is a photosensitive layer, a direction from the substrate to the photosensitive layer is referred to as "upward", and the opposite direction is referred to as "downward". Furthermore, such setting of upward and downward directions is for convenience in the present specification, and in a practical aspect, the "upward" direction in the present specification may be different from a vertically upward direction.

<Composition for Forming Pattern>

A composition for forming a pattern for imprinting according to an embodiment of the present invention contains a polymerizable compound, a photopolymerization initiator, and an organic halogen compound containing at least one atom selected from the group consisting of a chlorine atom, a bromine atom, and an iodine atom, the organic halogen compound is a compound which is stable to light of a mercury lamp, and a content of the organic halogen compound is 0.001% to 1.0% by mass with respect to a total solid content in the composition for forming a pattern.

In the present invention, in a case where the composition for forming a pattern contains a predetermined organic halogen compound in an amount in a predetermined range, temporal stability (releasability or the like in a case of using an aged liquid) of the composition for forming a pattern is improved. The reason for that is not clear, but it is presumed that this is because polarity of a halogen atom in the organic halogen compound, or a trace amount of halide ions present due to liberation from the organic halogen compound or the like inactivates an active site generated on a surface of a mold due to the repeated use of the mold, to suppress attachment of the composition for forming a pattern to the mold. Here, the "active site" refers to a group which has polarity and is generated on the outermost surface of the mold due to ultraviolet light radiated during curing of the composition for forming a pattern, or the release from the composition for forming a pattern.

Hereinafter, each component of the composition for forming a pattern according to the embodiment of the present invention will be described in detail.

<<Organic Halogen Compound>>

The organic halogen compound contained in the composition for forming a pattern according to the embodiment of the present invention is an organic compound containing at least one atom selected from the group consisting of a chlorine atom, a bromine atom, and an iodine atom. The organic halogen compound may be present in an ionic state, that is, in a state where a halide ion is liberated from the organic halogen compound. The halogen atom preferably includes at least one of a chlorine atom or a bromine atom, and more preferably includes a chlorine atom. This is because the chlorine atom and the bromine atom are more likely to have polarity in the organic halogen compound, and more likely to be stably liberated from the organic halogen compound. Consequently, the halide ion is efficiently liberated from the organic halogen compound, and the temporal stability of the composition for forming a pattern is further improved.

The halogen atom in the organic halogen compound is preferably bonded to at least one kind selected from an alkylene group or a ring structure which will be described later, and more preferably bonded to an alkylene group. Examples of an aspect, in which the halogen atom is bonded to an alkylene group, include an aspect (first aspect) in which the halogen atom is linked to a ring structure via an alkylene group, and an aspect (second aspect) in which the halogen atom is linked to an olefin structure via the alkylene group, and the first aspect is particularly preferable. The number of carbon atoms in the alkylene group is preferably 1 to 20, more preferably 1 to 10, and still more preferably 1 to 5. In particular, the alkylene group is preferably a methylene group or an ethylene group, and more preferably a methylene group. The number of halogen atoms is preferably 1 to 5 per molecule. The upper limit of the numerical range is more preferably 4 or less and still more preferably 3 or less. The number of halogen atoms is particularly preferably 1 or 2 per molecule. In a case where the number of halogen atoms is within the above range, both the improvement in the temporal stability and the suppression of an influence on a metal are more likely to be achieved.

A molecular weight of the organic halogen compound is preferably 100 to 1,000. The upper limit of the numerical range is more preferably 800 or less, still more preferably 650 or less, particularly preferably 550 or less, and even more preferably 450 or less. The lower limit of the numerical range is more preferably 120 or greater, still more preferably 130 or greater, particularly preferably 140 or greater, and even more preferably 150 or greater. In a case where the molecular weight of the organic halogen compound is within the above range, the halogen atom in the organic halogen compound is more likely to have polarity, and dispersibility of the organic halogen compound is improved.

The organic halogen compound preferably has a ring structure. Consequently, volatilization of the organic halogen compound is suppressed, and the organic halogen compound is more likely to be stably present in the composition for forming a pattern. Moreover, in a case where the polymerizable compound also has a ring structure, compatibility with this polymerizable compound is improved, and homogeneity of the composition for forming a pattern is also improved.

The ring structure of the organic halogen compound may be any of an aliphatic ring, an aromatic ring, or a heterocyclic ring (having both aromaticity and non-aromaticity), and is more preferably an aliphatic ring or an aromatic ring and still more preferably an aromatic ring. Here, the aliphatic ring is preferably cycloalkane or cycloalkene and more preferably cycloalkane. The aromatic ring may be a single ring or a polycyclic ring, and is preferably a single ring or a fused ring and more preferably a single ring. Moreover, the number of rings in one molecule is not particularly limited, but is preferably 5 or less, more preferably 3 or less, and particularly preferably 2 or less, and may be 1. Specific examples of the ring structure include a cyclopentane ring, a cyclohexane ring, a benzene ring, a naphthalene ring, a fluorene ring, a biphenyl structure, a diphenyl methane structure, a diphenyl ether structure, and a 9,9-bisphenylfluorene structure. Among them, the ring structure is preferably a benzene ring, a naphthalene ring, a fluorene ring, a biphenyl structure, a diphenyl methane structure, or a diphenyl ether structure, and more preferably a benzene ring. By adopting such a ring structure, the halide ion is more likely to be liberated from the organic halogen compound.

Furthermore, the ring structure may have a substituent, and the substituent is preferably the following substituent T. The substituent T is, for example, a halogen atom, a cyano group, a nitro group, a hydrocarbon group, a heteroaryl group, —$ORt^1$, —$CORt^1$, —$COORt^1$, —$OCORt^1$, —$NRt^1Rt^2$, —$NHCORt^1$, —$CONRt^1Rt^2$, —$NHCONRt^1Rt^2$, —$NHCOORt^1$, —$SRt^1$, —$SO_2Rt^1$, —$SO_2ORt^1$, —$NHSO_2Rt^1$, or —$SO_2NRt^1Rt^2$. $Rt^1$ and $Rt^2$ each independently represent a hydrogen atom, a hydrocarbon group, or a heterocyclic group. $Rt^1$ and $Rt^2$ may be bonded to each other to form a ring.

Regarding the substituent T, examples of the halogen atom include a fluorine atom, a chlorine atom, a bromine atom, and an iodine atom. Examples of the hydrocarbon group include an alkyl group, an alkenyl group, an alkynyl group, and an aryl group. The number of carbon atoms in the alkyl group is preferably 1 to 10, more preferably 1 to 5, and still more preferably 1 or 2. The alkyl group may be linear, branched, or cyclic, and is preferably linear or branched and more preferably branched. The number of carbon atoms in the alkenyl group is preferably 2 to 10, more preferably 2 to 5, and particularly preferably 2 or 3. The alkenyl group may be linear, branched, or cyclic, and is preferably linear or branched. The number of carbon atoms in the alkynyl group is preferably 2 to 10 and more preferably 2 to 5. The alkynyl group may be linear, branched, or cyclic, and is preferably linear or branched. The number of carbon atoms in the aryl group is preferably 6 to 10, more preferably 6 to 8, and still more preferably 6 or 7. The heterocyclic group may be a single ring or a polycyclic ring. The heterocyclic group is preferably a single ring or a polycyclic ring having 2 to 4 rings. The number of heteroatoms constituting the ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 10, more preferably 3 to 8, and still more preferably 3 to 5.

The hydrocarbon group and the heterocyclic group may further have a substituent or may be unsubstituted. Examples of the substituent here include the aforementioned substituents T.

It is also preferable that the organic halogen compound has a polymerizable group. Consequently, compatibility with the polymerizable compound, which is a main component of the composition for forming a pattern, is improved. The kind of the polymerizable group is not particularly limited, but, for example, a group (hereinafter, also referred to as an "ethylenically unsaturated bond-containing group") having an ethylenically unsaturated bond, an epoxy group, and the like are preferable, and an ethylenically unsaturated bond-containing group is more preferable. As the ethylenically unsaturated bond-containing group, for example, a vinyl group, an ethynyl group, a (meth)acryloyl group, a (meth)acryloyloxy group, and the like are preferable, a (meth)acryloyl group and a (meth)acryloyloxy group are more preferable, and an acryloyl group and an acryloyloxy group are still more preferable. Furthermore, in the present invention, in a case where the "organic halogen compound" has the polymerizable group, this compound is not treated as the "polymerizable compound" in the present invention.

In addition, it is also preferable that the composition for forming a pattern according to the embodiment of the present invention contains a compound represented by Formula (D1) as the organic halogen compound.

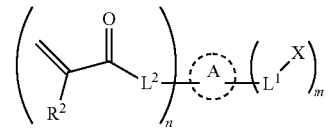

Formula (D1)

In Formula (D1), A represents a ring structure, $L^1$'s each independently represent a single bond or a divalent linking group connecting the ring structure A and X, X's each independently represent a chlorine atom, a bromine atom, or an iodine atom, and m represents an integer of 1 to 4. Moreover, $L^2$ represents a single bond or a divalent linking group connecting a carbon atom and the ring structure A, $R^2$ represents a hydrogen atom or a methyl group, and n represents an integer of 0 to 4.

The ring structure A is the ring structure described above, and is particularly preferably a cyclopentane ring, a cyclohexane ring, a benzene ring, a naphthalene ring, a fluorene ring, a biphenyl structure, a diphenyl methane structure, a diphenyl ether structure, or a ring structure such as bisphenylfluorene. The ring structure A may have the aforementioned substituent T.

$L^1$ as a linking group is preferably a linear or branched hydrocarbon group. The hydrocarbon group may have —O—, —S—, a sulfonyl group, a carbonyl group, a thiocarbonyl group, or —NR$^N$— (R$^N$ is a hydrogen atom or a monovalent substituent), in a hydrocarbon chain. Specifically, $L^1$ as a linking group is, for example, an alkylene group (the number of carbon atoms is preferably 1 to 20, more preferably 1 to 10, and still more preferably 1 to 5), an alkenylene group (the number of carbon atoms is preferably 2 to 12, more preferably 2 to 6, and still more preferably 2 or 3), —O—, —S—, a sulfonyl group, a carbonyl group, a thiocarbonyl group, —NR$^N$—, and a hydrocarbon group related to a combination thereof. The hydrocarbon group related to a combination thereof is, for example, an alkyleneoxy group (the number of carbon atoms is preferably 1 to 12, more preferably 1 to 6, and still more preferably 1 to 3), an alkylene sulfide group (the number of carbon atoms is preferably 1 to 12, more preferably 1 to 6, and still more preferably 1 to 3), an oligoalkyleneoxy group (the number of carbon atoms in an alkylene group in one constitutional unit is preferably 1 to 12, more preferably 1 to 6, and still more preferably 1 to 3, and the repetition number is preferably 2 to 10, more preferably 2 to 5, and still more preferably 2 or 3), and the like. It is preferable that $L^1$ as a linking group is constituted of only a hydrocarbon chain without having a structure including an oxygen atom, a nitrogen atom, or a sulfur atom as described above. $L^1$ as a linking group may have the aforementioned substituent T.

$L^1$ is preferably a single bond, a linear or branched alkylene group, or a linear or branched alkenylene group. $L^1$ is more preferably a single bond, a linear or branched alkylene group having 1 to 5 carbon atoms, or a linear or branched alkenylene group having 2 to 6 carbon atoms. In particular, $L^1$ is preferably a single bond, or a linear or branched alkylene group having 1 to 5 carbon atoms, more preferably a single bond, or a linear or branched alkylene group having 1 to 3 carbon atoms, still more preferably a single bond, a methylene group, or an ethylene group, and even more preferably a methylene group.

X is preferably a chlorine atom or a bromine atom, and more preferably a chlorine atom. m is preferably 1 to 3 and more preferably 1 or 2, and may be 1. In a case where m is 2 or greater, m pieces of $L^1$'s may be each independently the same as or different from each other, and m pieces of X's may be each independently the same as or different from each other.

A structure in a parenthesis, to which n is attached, can also be said to indicate a partial structure having a (meth)acryloyl group as the ethylenically unsaturated bond-containing group. This ethylenically unsaturated bond-containing group preferably includes a (meth)acryloyloxy group. Moreover, $R^2$ is preferably a hydrogen atom.

n is preferably 0 to 3 and more preferably 0 to 2, and may be 0 or 1. In a case where n is 1 or greater, there is an effect of further improving the compatibility with the polymerizable compound in the composition for forming a pattern. Moreover, m+n is preferably 1 to 5, more preferably 1 to 4, and still more preferably 2 or 3. By setting m+n within the above range, the compound can be designed to have an appropriate molecular weight, has low volatility, can be stably present at room temperature, and has an effect of suppressing an increase in a viscosity in a case of being dissolved in the composition for forming a pattern.

$L^2$ is preferably a divalent linking group and more preferably the same linking group as the divalent linking group described for $L^1$, for example. That is, $L^2$ as a linking group is, for example, an alkylene group (the number of carbon atoms is preferably 1 to 20, more preferably 1 to 10, and still more preferably 1 to 5), an alkenylene group (the number of carbon atoms is preferably 2 to 12, more preferably 2 to 6, and still more preferably 2 or 3), —O—, —S—, a sulfonyl group, a carbonyl group, a thiocarbonyl group, —NR$^N$—, and a hydrocarbon group related to a combination thereof. The hydrocarbon group related to a combination thereof is, for example, an alkyleneoxy group (the number of carbon atoms is preferably 1 to 12, more preferably 1 to 6, and still more preferably 1 to 3), an alkylene sulfide group (the number of carbon atoms is preferably 1 to 12, more preferably 1 to 6, and still more preferably 1 to 3), an oligoalkyleneoxy group (the number of carbon atoms in an alkylene group in one constitutional unit is preferably 1 to 12, more preferably 1 to 6, and still more preferably 1 to 3, and the repetition number is preferably 2 to 10, more preferably 2 to 5, and still more preferably 2 or 3), and the like. In a case where $L^2$ as a linking group contains an oxygen atom, a nitrogen atom, or a sulfur atom, the ethylenically unsaturated bond-containing group in a parenthesis, to which n is attached, is preferably a (meth)acryloyloxy group. $L^2$ as a linking group may be constituted of only a hydrocarbon chain without having a structure including an oxygen atom, a nitrogen atom, or a sulfur atom. $L^2$ as a linking group may have the aforementioned substituent T.

In particular, $L^2$ is preferably a single bond, a linear or branched alkylene group, a linear or branched alkenylene group, a linear or branched alkyleneoxy group, or a linear or branched oligoalkyleneoxy group. $L^2$ as a linking group is more preferably a linear or branched alkylene group having 1 to 5 carbon atoms, a linear or branched alkenylene group having 2 to 6 carbon atoms, a linear or branched alkyleneoxy group having 1 to 5 carbon atoms, or an oligoalkyleneoxy group (the number of carbon atoms in an alkylene group in one constitutional unit is 1 to 3, and the repetition number is 2 or 3). Among them, $L^2$ as a linking group is preferably a linear or branched alkylene group having 1 to 3 carbon atoms, a linear or branched alkenylene group having 2 or 3 carbon atoms, a linear or branched alkyleneoxy group having 1 to 3 carbon atoms, or an oligoalkyleneoxy group (the number of carbon atoms in an alkylene group in one constitutional unit is 1 or 2, and the repetition number is 2), and more preferably a methylene group, an ethylene group, or a methyleneoxy group.

In Formula (D1), it is also preferable that n is 0. That is, it is also preferable that the composition for forming a pattern according to the embodiment of the present invention contains a compound represented by Formula (D2) as the organic halogen compound.

Formula (D2)

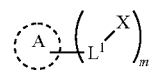

A, $L^1$, X, and m in Formula (D2) have the same definitions as A, $L^1$, X, and m in Formula (D1), respectively.

That is, also in Formula (D2), the ring structure A is preferably an aliphatic ring or an aromatic ring, and more preferably an aromatic ring. Among them, the ring structure A is preferably a cyclopentane ring, a cyclohexane ring, a benzene ring, a naphthalene ring, a fluorene ring, a biphenyl structure, a diphenyl methane structure, a diphenyl ether structure, or a ring structure such as bisphenylfluorene. The ring structure A may have the aforementioned substituent T. Moreover, $L^1$ is preferably a single bond, or a linear or branched alkylene group having 1 to 5 carbon atoms, more preferably a single bond, or a linear or branched alkylene group having 1 to 3 carbon atoms, and still more preferably a single bond, a methylene group, or an ethylene group. X is preferably a chlorine atom or a bromine atom, and more preferably a chlorine atom. m is preferably 1 to 3 and more preferably 1 or 2, and may be 1. In a case where m is 2 or greater, m pieces of $L^1$'s may be each independently the same as or different from each other, and m pieces of X's may be each independently the same as or different from each other.

Furthermore, it is also preferable that the composition for forming a pattern according to the embodiment of the present invention contains a compound represented by Formula (D3) as the organic halogen compound.

$$R^D\text{-}(X)_m \qquad \text{Formula (D3):}$$

In Formula (D3), $R^D$ represents a linear or branched m-valent organic group, X's each independently represent a chlorine atom, a bromine atom, or an iodine atom, and m represents an integer of 1 to 4.

The organic group $R^D$ is preferably a linear or branched hydrocarbon group. The hydrocarbon group may have —O—, —S—, a sulfonyl group, a carbonyl group, a thiocarbonyl group, or —$NR^N$— ($R^N$ is a hydrogen atom or a monovalent substituent), in a hydrocarbon chain. Specifically, the organic group $R^D$ is, for example, an alkyl group (the number of carbon atoms is preferably 1 to 20, more preferably 3 to 18, and still more preferably 5 to 15), an alkenyl group (the number of carbon atoms is preferably 2 to 12, more preferably 3 to 10, and still more preferably 4 to 8), an alkynyl group (the number of carbon atoms is preferably 2 to 12, more preferably 3 to 10, and still more preferably 4 to 8), an alkylene group (the number of carbon atoms is preferably 1 to 20, more preferably 3 to 18, and still more preferably 5 to 15), an alkenylene group (the number of carbon atoms is preferably 2 to 12, more preferably 3 to 10, and still more preferably 4 to 8), an alkynylene group (the number of carbon atoms is preferably 2 to 12, more preferably 3 to 10, and still more preferably 4 to 8), —O—, —S—, a sulfonyl group, a carbonyl group, a thiocarbonyl group, —$NR^N$—, and a hydrocarbon group related to a combination thereof. The hydrocarbon group related to a combination thereof is, for example, an alkoxy group (the number of carbon atoms is preferably 1 to 12, more preferably 3 to 10, and still more preferably 4 to 8), an alkenyloxy group (the number of carbon atoms is preferably 1 to 12, more preferably 3 to 10, and still more preferably 4 to 8), an alkyleneoxy group (the number of carbon atoms is preferably 1 to 12, more preferably 3 to 10, and still more preferably 4 to 8), an alkylene sulfide group (the number of carbon atoms is preferably 1 to 12, more preferably 3 to 10, and still more preferably 4 to 8), an oligoalkyleneoxy group (the number of carbon atoms in an alkylene group in one constitutional unit is preferably 1 to 12, more preferably 1 to 6, and still more preferably 1 to 3, and the repetition number is preferably 2 to 10, more preferably 2 to 5, and still more preferably 2 or 3), and the like. It is preferable that the organic group $R^D$ is constituted of only a hydrocarbon chain without having a structure including an oxygen atom, a nitrogen atom, or a sulfur atom. Moreover, the organic group $R^D$ may have the aforementioned substituent T.

In particular, the organic group $R^D$ is preferably a linear or branched alkyl group, a linear or branched alkenyl group, a linear or branched alkynyl group, a linear or branched alkylene group, a linear or branched alkenylene group, a linear or branched alkynylene group, a linear or branched alkyleneoxy group, or a linear or branched oligoalkyleneoxy group. The organic group $R^D$ is more preferably a linear or branched alkyl group having 3 to 18 carbon atoms, a linear or branched alkenyl group having 3 to 10 carbon atoms, a linear or branched alkynyl group having 3 to 10 carbon atoms, a linear or branched alkylene group having 3 to 18 carbon atoms, a linear or branched alkenylene group having 3 to 10 carbon atoms, a linear or branched alkynylene group having 3 to 10 carbon atoms, a linear or branched alkyleneoxy group having 3 to 10 carbon atoms, or an oligoalkyleneoxy group (the number of carbon atoms in an alkylene group in one constitutional unit is 1 to 3, and the repetition number is 2 or 3). Among them, the organic group $R^D$ is preferably a linear or branched alkyl group having 4 to 15 carbon atoms, a linear or branched alkenyl group having 4 to 8 carbon atoms, a linear or branched alkylene group having 4 to 15 carbon atoms, a linear or branched alkenylene group having 4 to 8 carbon atoms, a linear or branched alkyleneoxy group having 4 to 8 carbon atoms, or an oligoalkyleneoxy group (the number of carbon atoms in an alkylene group in one constitutional unit is 1 to 3, and the repetition number is 2), and more preferably a linear alkyl group having 4 to 10 carbon atoms, a linear alkenyl group having 4 to 8 carbon atoms, a linear alkylene group having 4 to 10 carbon atoms, a linear alkenylene group having 4 to 8 carbon atoms, a linear alkyleneoxy group having 4 to 8 carbon atoms, or an oligoalkyleneoxy group (the number of carbon atoms in an alkylene group in one constitutional unit is 1 to 3, and the repetition number is 2).

The organic halogen compound in the present invention is stable to light (for example, light having a wavelength of 300 to 450 nm) of a mercury lamp. The "being stable to light of a mercury lamp" means that decomposition such as generation of ions or radicals due to irradiation of the light of the mercury lamp is less likely to occur. In the present invention, for example, in a case where the organic halogen compound is dissolved in an organic solvent typified by propylene glycol monomethyl ether acetate to prepare a 0.10% by mass solution, and this solution is put in a quartz-made optical cell having an optical path length of 1 cm and irradiated with light of an ultra-high pressure mercury lamp for 60 seconds from a close distance, a decomposition rate of the organic halogen compound is less than 1%. The decomposition rate can be estimated from, for example, an amount of change in an absorption spectrum. Consequently, in a case where the mold is repeatedly used, the active site generated on the surface of the mold can be efficiently inactivated. The organic halogen compound is preferably stable to light having an exposure amount of at least 1 mJ/cm², more preferably stable to light having an exposure amount of 2 mJ/cm² or greater, and still more preferably stable to light having an exposure amount of 5 mJ/cm² or greater. Moreover, it is enough that the organic halogen compound is practically stable to light having an exposure amount of 10 mJ/cm² or less.

The organic halogen compound in the present invention preferably does not contain atoms other than a chlorine atom (Cl), a bromine atom (Br), and an iodine atom (I), among atoms of the third period and subsequent periods in the element periodic table, and is more preferably constituted of only atoms selected from the group consisting of a carbon atom, a hydrogen atom, an oxygen atom, a chlorine atom, a bromine atom, and an iodine atom. In particular, the organic halogen compound in the present invention preferably does not have a siloxy group. In a case where the organic halogen compound does not have a siloxy group, it is possible to suppress that a siloxy group is bonded to the surface of the mold to increase an amount of attachments on the surface of the mold, and that residual defects are generated during dry etching performed using the formed pattern as a mask.

Specific examples of the organic halogen compound are as follows. However, in the present invention, the organic halogen compound is not limited to compounds shown below.

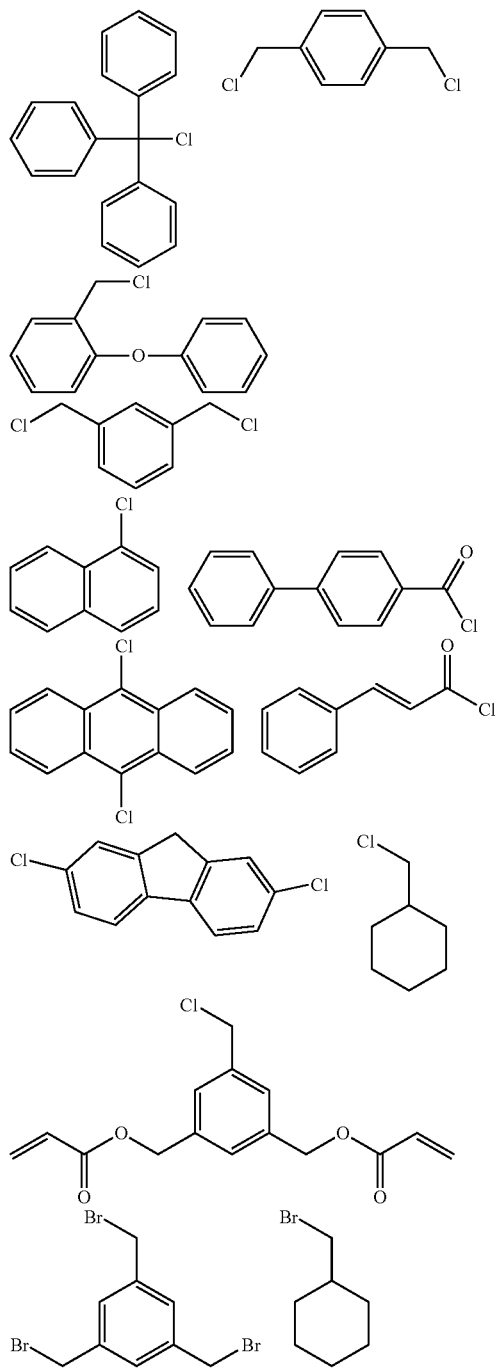

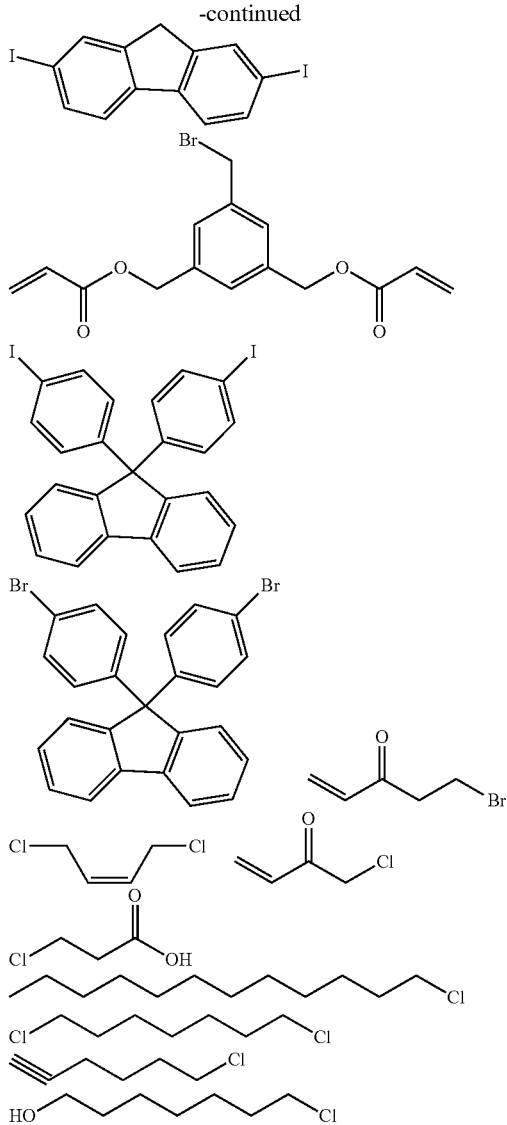

The content of the organic halogen compound (also including an organic halogen compound in an ionic state) is 0.001% to 1.0% by mass with respect to the total solid content in the composition for forming a pattern. The upper limit of the numerical range is more preferably 0.8% by mass or less, still more preferably 0.5% by mass or less, and particularly preferably 0.05% by mass or less. Moreover, the lower limit of the numerical range is more preferably 0.005% by mass or greater, still more preferably 0.008% by mass or greater, and particularly preferably 0.01% by mass or greater. In a case where the content of the organic halogen compound is within the above range, a halogen atom having polarity or a halide ion can be sufficiently ensured in the composition, and the temporal stability of the composition for forming a pattern is further improved. Furthermore, in a case where the content of the organic halogen compound is within the above range, the presence of the halide ion can also further suppress an influence of corrosion of a pipe in an imprint device, or equipment and machinery for imprinting, such as an imprint head, or the like.

The organic halogen compound may be used alone or in combination of two or more kinds thereof. In a case where two or more kinds of the organic halogen compounds are used in combination, the total amount thereof is preferably within the above range.

<<Halide Ion>>

The composition for forming a pattern according to the embodiment of the present invention preferably contains a predetermined halide ion. The halide ion in the present invention preferably includes at least one halide ion selected from a chloride ion ($Cl^-$), a bromide ion ($Br^-$), or an iodide ion ($I^-$). Consequently, the temporal stability of the composition for forming a pattern for imprinting is further improved. The halide ion can be obtained, for example, by being liberated from the aforementioned organic halogen compound. Moreover, the total content of the chloride ion, the bromide ion, and the iodide ion is preferably 0.005 to 1,100 ppm by mass with respect to the total solid content in the composition. The upper limit of the numerical range is more preferably 1,000 ppm by mass or less, still more preferably 500 ppm by mass or less, and particularly preferably 100 ppm by mass or less. Moreover, the lower limit of the numerical range is more preferably 0.05 ppm by mass or greater, still more preferably 1 ppm by mass or greater, and particularly preferably 10 ppm by mass or greater. By setting the total content of the halide ions to be equal to or greater than the lower limit, the temporal stability of the composition for forming a pattern is further improved. Furthermore, by setting the content of the halide ions to be equal to or less than the upper limit, even in a case where the composition for forming a pattern is brought into contact with a pipe in equipment for imprinting or a metal part in an ink jet head, pitting corrosion in which corrosion is introduced from dot-like defects of a barrier layer formed on a surface of the metal part is less likely to occur, and corrosion of the metal part is further effectively suppressed.

The halide ion may be used alone or in combination of two or more kinds thereof. In a case where two or more kinds of the halide ions are used in combination, the total amount thereof is preferably within the above range.

<<Moisture>>

The composition for forming a pattern according to the embodiment of the present invention preferably contains moisture. The presence of the moisture in the composition forms an environment in which the halide ion is more likely to be liberated from the organic halogen compound. A content of the moisture is preferably 0.001% to 1.5% by mass with respect to the total amount of the composition for forming a pattern. The upper limit of the numerical range is more preferably 1.0% by mass or less, still more preferably 0.5% by mass or less, and particularly preferably 0.1% by mass or less. Moreover, the lower limit of the numerical range is more preferably 0.01% by mass or greater, still more preferably 0.03% by mass or greater, and particularly preferably 0.04% by mass or greater. In a case where the content of the moisture is within the above range, the temporal stability of the composition for forming a pattern is further improved. Furthermore, in a case where the content of the moisture is within the above range, the presence of the halide ion can also further suppress an influence of corrosion of a pipe in an imprint device, or equipment and machinery for imprinting, such as an imprint head, or the like. In a case where the content of the moisture is within the above range, precipitation of a small amount of metal ions contained in the composition for forming a pattern can be suppressed, and induction of defects in a pattern during etching processing using a pattern as a mask can be suppressed.

A method for adjusting the moisture content is not particularly limited. For example, the moisture content can be adjusted by a method for stirring the composition for forming a pattern in an atmosphere including moisture, a method for adding pure water as a raw material to the composition for forming a pattern, or the like.

<<Polymerizable Compound>>

As described above, the composition for forming a pattern according to the embodiment of the present invention contains a polymerizable compound having a polymerizable group. The polymerizable compound is preferably a radically polymerizable compound.

The polymerizable compound may be a monofunctional polymerizable compound having one polymerizable group, or a polyfunctional polymerizable compound having two or more polymerizable groups. The composition for forming a pattern according to the embodiment of the present invention preferably contains a polyfunctional polymerizable compound, and more preferably contains both a polyfunctional polymerizable compound and a monofunctional polymerizable compound. The polyfunctional polymerizable compound preferably includes at least one kind of a bifunctional polymerizable compound or a trifunctional polymerizable compound, and more preferably includes at least one kind of bifunctional polymerizable compounds.

Examples of the polymerizable group of the polymerizable compound include ethylenically unsaturated bond-containing groups such as a vinyl group, an allyl group, a vinylphenyl group, a (meth)acryloyl group, a (meth)acryloyloxy group, and a (meth)acryloylamino group. The polymerizable group is preferably a (meth)acryloyl group, a (meth)acryloyloxy group, and a (meth)acryloylamino group, and more preferably an acryloyl group, an acryloyloxy group, and an acryloylamino group.

A molecular weight of the polymerizable compound in the present invention is preferably less than 2,000, more preferably 1,500 or less, and still more preferably 1,000 or less, and may be 800 or less. The lower limit value thereof is preferably 100 or greater.

The polymerizable compound in the present invention may or may not contain a silicon atom. As such an embodiment, a case where the polymerizable compound is a polymerizable compound having a silicone skeleton is exemplified. Moreover, as another embodiment, a case where the polymerizable compound is a polymerizable compound containing no silicon atom is exemplified. Examples of the polymerizable compound having a silicone skeleton include SILICONE ACRYLATE X-22-1602 produced by Shin-Etsu Chemical Co., Ltd.

A content of the polymerizable compound of the present invention is preferably 40% by mass or greater, more preferably 60% by mass or greater, still more preferably 70% by mass or greater, particularly preferably 80% by mass or greater, and even more preferably 90% by mass or greater, with respect to the entire composition for forming a pattern. Moreover, the content of the polymerizable compound of the present invention is preferably 99.9% by mass or less, more preferably 99% by mass or less, and still more preferably 98% by mass or less, with respect to the entire composition for forming a pattern.

The composition for forming a pattern according to the embodiment of the present invention may contain only one kind or two or more kinds of the polymerizable compounds. In a case where two or more kinds thereof are contained, the total amount thereof is preferably within the above range.

The polymerizable compound preferably contains a partial structure obtained by removing a halogen atom from the organic halogen compound. Consequently, the compatibility between the polymerizable compound and the organic halogen compound is further improved.

In the composition for forming a pattern according to the embodiment of the present invention, the polymerizable compound may be decomposed with time by hydrolysis of a resin or the like. In a case where the composition for forming a pattern according to the embodiment of the present invention is used, a content of a decomposition product of the polymerizable compound is preferably 500 ppm by mass or less, more preferably 200 ppm by mass or less, and still more preferably 100 ppm by mass or less, with respect to the composition for forming a pattern. The lower limit of the numerical range is not particularly limited, but is, for example, 1 ppm by mass or greater. The content of the decomposition product of the polymerizable compound can be estimated from, for example, a content of a (meth)acrylic acid in a case where the polymerizable compound has a (meth)acryloyl group and a (meth)acryloyloxy group.

<<<Polyfunctional Polymerizable Compound>>>

In the present invention, in a case where the composition for forming a pattern contains a polyfunctional polymerizable compound as the polymerizable compound, the number of polymerizable groups of the polyfunctional polymerizable compound is 2 or more, preferably 2 to 7, more preferably 2 to 4, still more preferably 2 or 3, and even more preferably 2.

In the present invention, the polyfunctional polymerizable compound preferably includes a compound represented by Formula (2). By using such a polyfunctional polymerizable compound, adhesiveness, releasability, and temporal stability in the imprinting are well-balanced, and thus the composition for forming a pattern tends to be comprehensively superior.

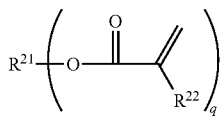

(2)

In the formula, $R^{21}$ is a q-valent organic group, $R^{22}$ is a hydrogen atom or a methyl group, and q is an integer of 2 or greater. q is preferably an integer of 2 to 7, more preferably an integer of 2 to 4, still more preferably 2 or 3, and even more preferably 2.

$R^{21}$ is preferably a divalent to heptavalent organic group, more preferably a divalent to tetravalent organic group, still more preferably a divalent or trivalent organic group, and even more preferably a divalent organic group. $R^{21}$ is preferably a hydrocarbon group having at least one of a linear structure, a branched structure, or a cyclic structure. The number of carbon atoms in the hydrocarbon group is preferably 2 to 20 and more preferably 2 to 10.

In a case where $R^{21}$ is a divalent organic group, $R^{21}$ is preferably an organic group represented by Formula (1-2).

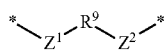

(1-2)

In the formula, it is preferable that $Z^1$ and $Z^2$ are each independently a single bond, —O—, -Alk-, or -Alk-O—. Alk represents an alkylene group (the number of carbon atoms is preferably 1 to 12, more preferably 1 to 6, and still more preferably 1 to 3), and may have a substituent as long as the effects of the present invention are not impaired. Examples of the substituent include the aforementioned substituent T (excluding substituents containing a chlorine atom, a bromine atom, and an iodine atom). In the present specification, the asterisk in the chemical formula indicates a bonding site.

$R^9$ is a single bond or a divalent linking group. The linking group is preferably a linking group selected from Formulae (9-1) to (9-10), or a combination thereof. Among them, a linking group selected from Formulae (9-1) to (9-3), (9-7), and (9-8) is preferable.

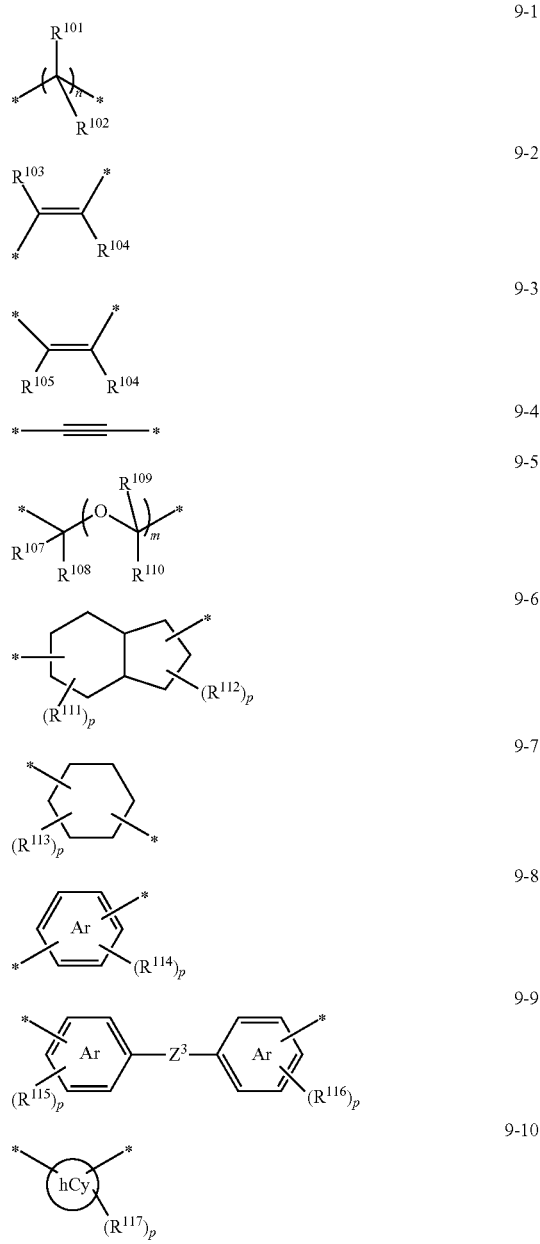

$R^{101}$ to $R^{117}$ are optional substituents. Among them, an alkyl group (the number of carbon atoms is preferably 1 to 12, more preferably 1 to 6, and still more preferably 1 to 3), an arylalkyl group (the number of carbon atoms is preferably 7 to 21, more preferably 7 to 15, and still more preferably 7 to 11), an aryl group (the number of carbon atoms is preferably 6 to 22, more preferably 6 to 18, and still more preferably 6 to 10), a thienyl group, a furyl group, a (meth)acryloyl group, a (meth)acryloyloxy group, and a (meth)acryloyloxyalkyl group (the number of carbon atoms in the alkyl group is preferably 1 to 24, more preferably 1 to 12, and still more preferably 1 to 6) are preferable. $R^{101}$ and $R^{102}$, $R^{103}$ and $R^{104}$, $R^{105}$ and $R^{106}$, $R^{107}$ and $R^{108}$, $R^{109}$ and $R^{110}$, a plurality of $R^{111}$'s, a plurality of $R^{112}$'s, a plurality of $R^{113}$'s, a plurality of $R^{114}$'s, a plurality of $R^{115}$'s, a plurality of $R^{116}$'s, and a plurality of $R^{117}$'s may be respectively bonded to each other to form a ring.

Ar is an arylene group (the number of carbon atoms is preferably 6 to 22, more preferably 6 to 18, and still more preferably 6 to 10), and specific examples thereof include a phenylene group, a naphthalenediyl group, an anthracenediyl group, a phenanthrenediyl group, and a fluorenediyl group.

hCy is a heterocyclic group (the number of carbon atoms is preferably 1 to 12, more preferably 1 to 6, and still more preferably 2 to 5), and is more preferably a 5-membered ring or a 6-membered ring. Specific examples of a hetero ring constituting hCy include a thiophene ring, a furan ring, a dibenzofuran ring, a carbazole ring, an indole ring, a tetrahydropyran ring, a tetrahydrofuran ring, a pyrrole ring, a pyridine ring, a pyrazole ring, an imidazole ring, a benzimidazole ring, a triazole ring, a thiazole ring, an oxazole ring, a pyrrolidone ring, and a morpholine ring, and among them, a thiophene ring, a furan ring, and a dibenzofuran ring are preferable.

$Z^3$ is a single bond or a linking group. Examples of the linking group include alkylene groups (the number of carbon atoms is preferably 1 to 12, more preferably 1 to 6, and still more preferably 1 to 3) in which an oxygen atom, a sulfur atom, and a fluorine atom may be substituted.

n and m are each a natural number of 100 or less, preferably 1 to 12, more preferably 1 to 6, and still more preferably 1 to 3.

p is 0 or greater and is an integer equal to or less than the maximum number of groups which can be substituted for each ring. In the respective cases, the upper limit values are independently preferably equal to or less than half of the maximum number of the substitutable group, more preferably 4 or less, and still more preferably 2 or less.

The polyfunctional polymerizable compound is preferably represented by Formula (2-1).

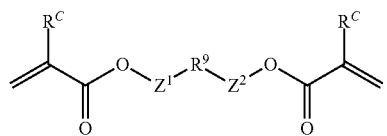

(2-1)

In Formula (2-1), RC is a hydrogen atom or a methyl group. Moreover, $R^9$, $Z^1$, and $Z^2$ have the same definitions as $R^9$, $Z^1$, and $Z^2$ in Formula (1-2), respectively, and preferred ranges thereof are also the same.

A kind of an atom constituting the polyfunctional polymerizable compound used in the present invention is not particularly specified, but the polyfunctional polymerizable compound is preferably constituted of only atoms selected from a carbon atom, an oxygen atom, a hydrogen atom, and a fluorine atom, and more preferably constituted of only atoms selected from a carbon atom, an oxygen atom, and a hydrogen atom. In particular, by having a fluorine atom, a polyfunctional polymerizable compound having releasability also functions as a release agent which will be described later.

Examples of the polyfunctional polymerizable compound preferably used in the present invention include the following compounds. Moreover, the examples include the polymerizable compound described in JP2014-170949A, the contents of which are incorporated in the present specification.

Compound B-1

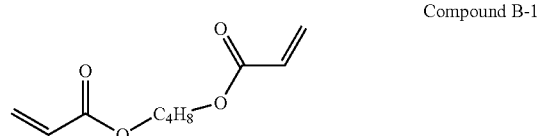

Compound B-2

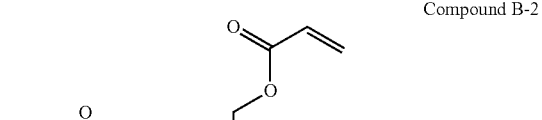

Compound B-3

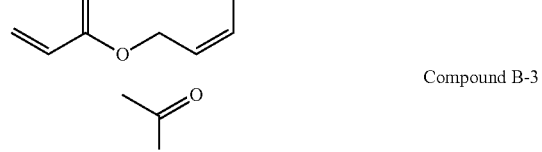

Compound B-4

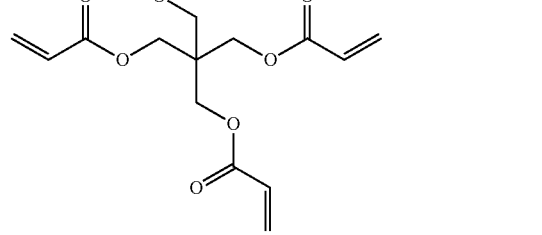

Compound B-5

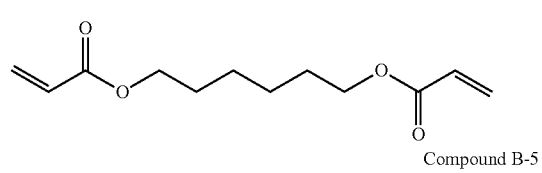

Compound B-6

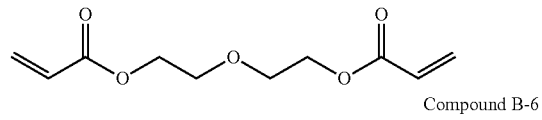

Compound B-7

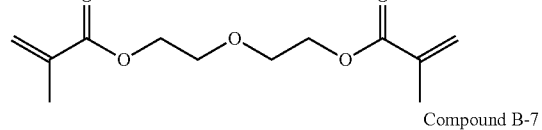

Compound B-8

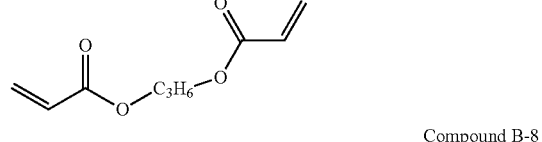

Compound B-9
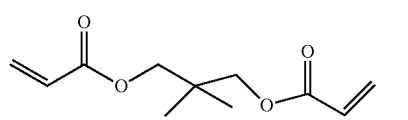
Compound B-10
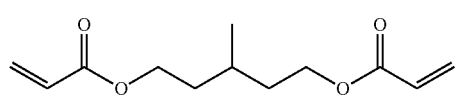
Compound B-11
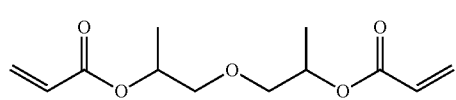
Compound B-12
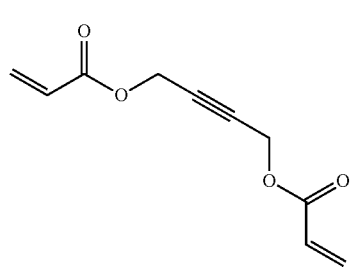
Compound B-13
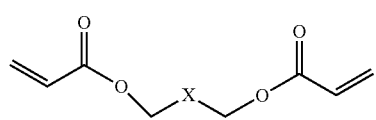
X = Linkage by A-B or B-A
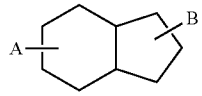
Compound B-14
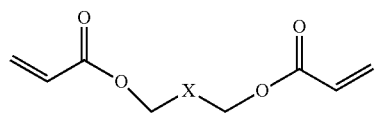
X = Linkage by A-B or B-A
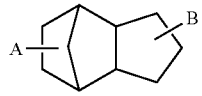
Compound B-15
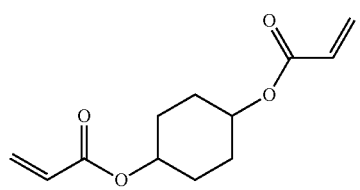
Compound B-16
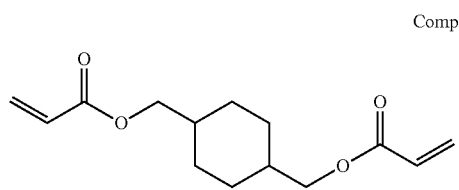
Compound B-17
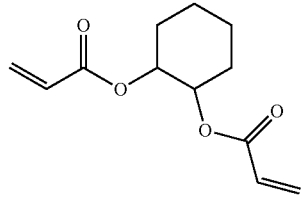
Compound B-18
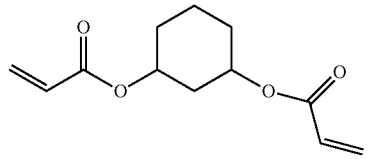
Compound B-19
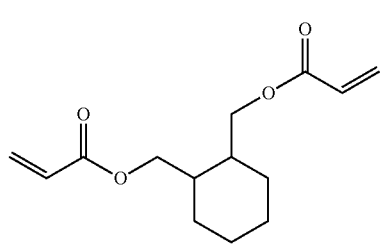
Compound B-20
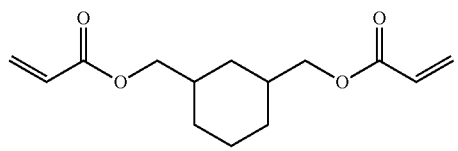
Compound B-21
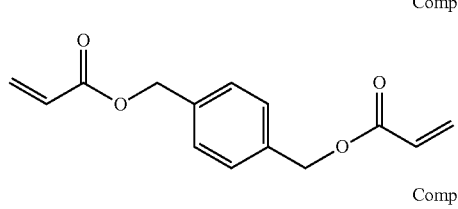
Compound B-22
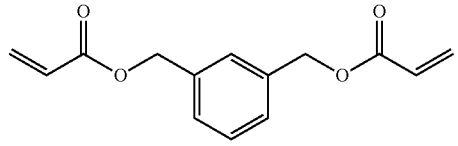
Compound B-23
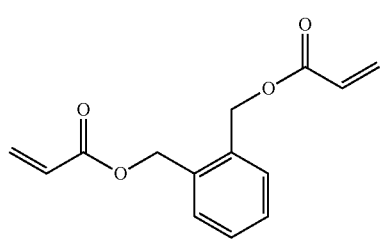
Compound B-24
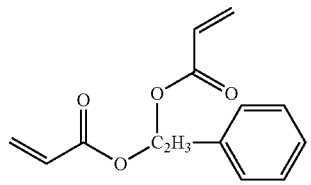

-continued

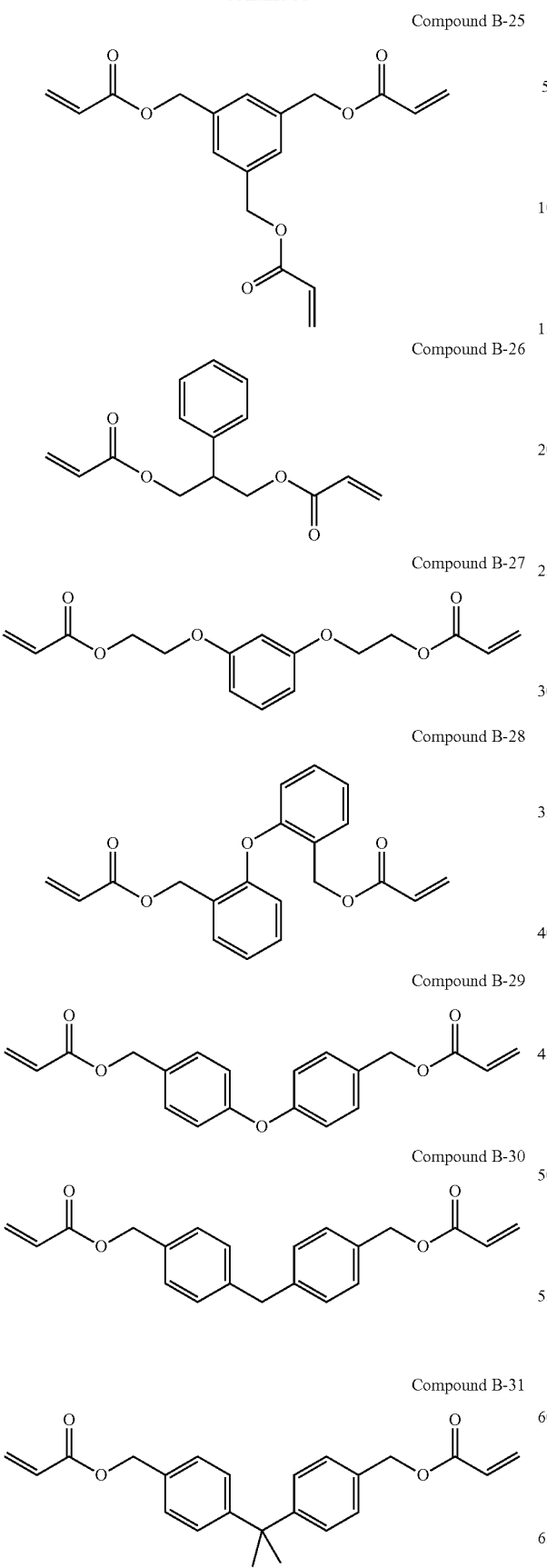

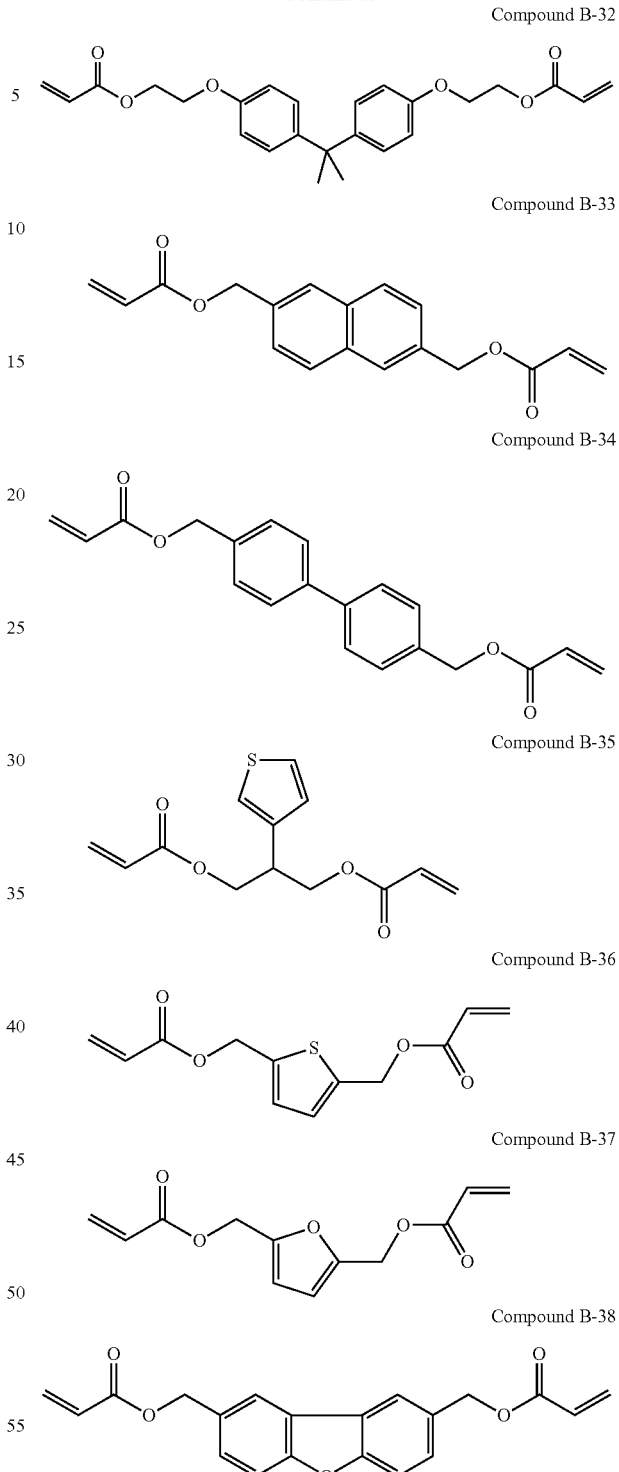

The content of the polyfunctional polymerizable compound used in the present invention is preferably 30% to 99% by mass, more preferably 50% to 95% by mass, and still more preferably 75% to 90% by mass, and may be 80% to 90% by mass, with respect to the total polymerizable compounds in the composition. The composition for forming a pattern may contain only one kind or two or more kinds of the polyfunctional polymerizable compounds. In a case where two or more kinds thereof are contained, the total amount thereof is preferably within the above range.

<<<Monofunctional Polymerizable Compound>>>

In the present invention, in a case where the composition for forming a pattern contains a monofunctional polymerizable compound as the polymerizable compound, the kind of the monofunctional polymerizable compound is not particularly specified as long as the kind does not depart from the spirit of the present invention. It is preferable that the monofunctional polymerizable compound used in the present invention has a cyclic structure, or a linear or branched hydrocarbon chain having 4 or more carbon atoms. In the present invention, only one kind or two or more kinds of the monofunctional polymerizable compounds may be contained.

The monofunctional polymerizable compound used in the present invention is preferably a liquid at 25° C.

In the present invention, the compound which is a liquid at 25° C. means a compound having fluidity at 25° C., for example, a compound having a viscosity at 25° C. of 1 to 100,000 mPa·s. For example, the viscosity of the monofunctional polymerizable compound at 25° C. is more preferably 10 to 20,000 mPa·s and still more preferably 100 to 15,000 mPa·s.

By using the compound which is a liquid at 25° C., a configuration in which the composition for forming a pattern does not substantially contain a solvent can be adopted. Here, the expression "not substantially contain a solvent" means, for example, that the content of the solvent in the composition for forming a pattern according to the embodiment of the present invention is 5% by mass or less. The content of the solvent in the composition for forming a pattern is preferably 3% by mass or less and more preferably 1% by mass or less.

The viscosity of the monofunctional polymerizable compound used in the present invention at 25° C. is preferably 100 mPa·s or lower, more preferably 10 mPa·s or lower, still more preferably 8 mPa·s or lower, and even more preferably 6 mPa·s or lower. By setting the viscosity of the monofunctional polymerizable compound at 25° C. to be equal to or lower than the upper limit value, the viscosity of the composition for forming a pattern can be reduced, and thus filling properties tend to be improved. The lower limit value thereof is not particularly specified, but can be, for example, 1 mPa·s or higher.

The monofunctional polymerizable compound used in the present invention is preferably a monofunctional (meth)acrylic monomer and more preferably monofunctional acrylate.

A kind of an atom constituting the monofunctional polymerizable compound used in the present invention is not particularly specified, but the monofunctional polymerizable compound is preferably constituted of only atoms selected from a carbon atom, an oxygen atom, a hydrogen atom, and a fluorine atom, and more preferably constituted of only atoms selected from a carbon atom, an oxygen atom, and a hydrogen atom. In particular, by having a fluorine atom, a monofunctional polymerizable compound having releasability also functions as the release agent which will be described later.

The monofunctional polymerizable compound used in the present invention preferably has a plastic structure. For example, it is preferable that at least one kind of the monofunctional polymerizable compounds used in the present invention contains one group selected from the group consisting of the following (1) to (3).

(1) A group (hereinafter, referred to as a "group (1)" in some cases) which has at least one of an alkyl chain or an alkenyl chain and at least one of an alicyclic structure or an aromatic ring structure, and has the total number of carbon atoms of 7 or more
(2) A group (hereinafter, referred to as a "group (2)" in some cases) having an alkyl chain having 4 or more carbon atoms
(3) A group (hereinafter, referred to as a "group (3)" in some cases) having an alkenyl chain having 4 or more carbon atoms With such a configuration, a modulus of elasticity of a cured film can be efficiently reduced while reducing the addition amount of the monofunctional polymerizable compound contained in the composition for forming a pattern. Moreover, interfacial energy with the mold is reduced, and thus an effect of reducing a releasing force (effect of improving releasability) can be enhanced.

In the groups (1) to (3), the alkyl chain and the alkenyl chain may be linear, branched, or cyclic, and are each independently preferably linear or branched. Moreover, it is preferable that the groups (1) to (3) have at least one kind of the alkyl chain or the alkenyl chain at a terminal of the monofunctional polymerizable compound, that is, at least one kind of an alkyl group or an alkenyl group at the terminal. With such a structure, the releasability can be further improved.

The alkyl chain and the alkenyl chain may each independently contain an ether group (—O—), but it is preferable that an ether group is not contained from the viewpoint of improvement in the releasability.

Group (1)

The total number of carbon atoms in the group (1) is preferably 35 or less and more preferably 10 or less.

As the cyclic structure, a single ring of 3- to 8-membered rings, or a polycyclic ring obtained by combining these single rings is preferable. The number of rings constituting the polycyclic ring is preferably 2 or 3. The cyclic structure is more preferably a 5-membered ring or a 6-membered ring and still more preferably a 6-membered ring. Moreover, a single ring is more preferable. As the cyclic structure in the group (1), a cyclohexane ring, a benzene ring, and a naphthalene ring are more preferable, and a benzene ring is particularly preferable. Moreover, the cyclic structure is preferably an aromatic ring structure.

The number of cyclic structures in the group (1) may be 1 or may be 2 or more, but is preferably 1 or 2 and more preferably 1. Furthermore, in a case of a fused ring, the fused ring is considered as one cyclic structure.

Group (2)

The group (2) is a group having an alkyl chain having 4 or more carbon atoms, and preferably a group (that is, an alkyl group) consisting of an alkyl chain having 4 or more carbon atoms. The number of carbon atoms in the alkyl chain is preferably 7 or more and more preferably 9 or more. The upper limit value of the number of carbon atoms in the alkyl chain is not particularly limited, but can be, for example, 25 or less. Moreover, a compound in which some carbon atoms of the alkyl chain are substituted with silicon atoms can also be exemplified as the monofunctional polymerizable compound.

Group (3)

The group (3) is a group having an alkenyl chain having 4 or more carbon atoms, and preferably a group (that is, an alkylene group) consisting of an alkenyl chain having 4 or more carbon atoms. The number of carbon atoms in the alkenyl chain is preferably 7 or more and more preferably 9 or more. The upper limit value of the number of carbon atoms in the alkenyl chain is not particularly limited, but can be, for example, 25 or less.

The monofunctional polymerizable compound used in the present invention is preferably a compound in which any one or more of the group (1), . . . , or (3) are bonded to a polymerizable group directly or via a linking group, and more preferably a compound in which any one of the group (1), . . . , or (3) is directly bonded to a polymerizable group. Examples of the linking group include —O—, —C(=O)—, —CH$_2$—, —NH—, or a combination thereof.

Specific examples of the monofunctional polymerizable compound are as follows. However, in the present invention, the monofunctional polymerizable compound is not limited to the following compounds.

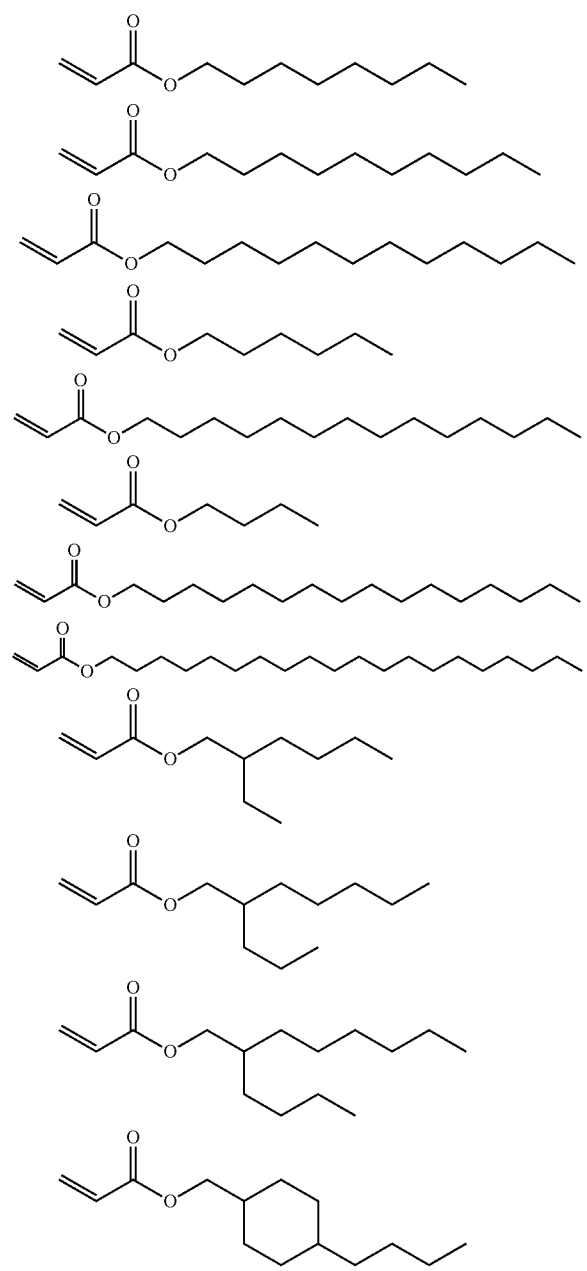

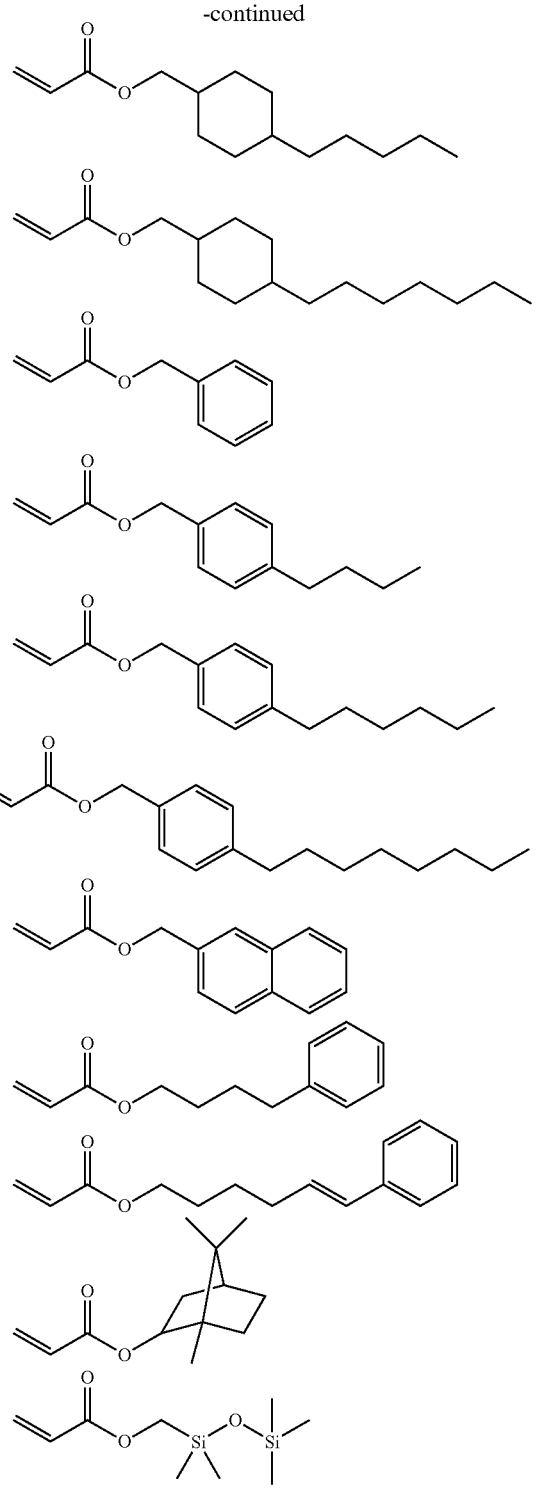

The lower limit value of an amount of the monofunctional polymerizable compound with respect to the total polymerizable compounds in the composition for forming a pattern is preferably 1% by mass or greater, more preferably 3% by mass or greater, still more preferably 5% by mass or greater, and even more preferably 7% by mass or greater. Moreover, the upper limit value thereof is preferably 29% by mass or less, more preferably 27% by mass or less, still more preferably 25% by mass or less, even more preferably 20% by mass or less, and further still more preferably 15% by mass or less. By setting the amount of the monofunctional polymerizable compound with respect to the total polymerizable compounds to be equal to or greater than the lower limit value, the releasability can be improved, and thus defects in a pattern or damage to the mold can be suppressed in a case of releasing the mold. Furthermore, by setting the amount to be equal to or less than the upper limit value, a Tg of a cured film of the composition for forming a pattern can be increased, and thus resistance to etching processing, in particular, waviness of a pattern during etching can be suppressed.

In the present invention, monofunctional polymerizable compounds other than the aforementioned monofunctional polymerizable compound may be used as long as the compounds do not depart from the spirit of the present invention, and examples thereof include the monofunctional polymerizable compounds among the polymerizable compounds described in JP2014-170949A, the contents of which are incorporated in the present specification.

<<Polymerization Initiator>>

The composition for forming a pattern according to the embodiment of the present invention contains a photopolymerization initiator. Moreover, the photopolymerization initiator is preferably a photoradical polymerization initiator. As the photoradical polymerization initiator used in the present invention, any compound can be used as long as the compound generates an active species which polymerizes the aforementioned polymerizable compounds by light irradiation.

As the photoradical polymerization initiator, for example, commercially available initiators can be used. As examples thereof, the initiators described in, for example, paragraph 0091 of JP2008-105414A can be preferably adopted. Among them, an acetophenone-based compound, an acylphosphine oxide-based compound, and an oxime ester-based compound are preferable from the viewpoints of curing sensitivity and absorption characteristics. Examples of a commercially available product thereof include IRGACURE (registered trademark) 1173, IRGACURE 184, IRGACURE 2959, IRGACURE 127, IRGACURE 907, IRGACURE 369, IRGACURE 379, LUCIRIN (registered trademark) TPO, IRGACURE 819, IRGACURE OXE-01, IRGACURE OXE-02, IRGACURE 651, and IRGACURE 754 (all produced by BASF SE), Omnirad 369 and Omnirad 651 (all produced by IGM Resins B.V), and V-601 (produced by FUJIFILM Wako Pure Chemical Corporation).

In the present invention, an oxime compound having a fluorine atom can also be used as the photoradical polymerization initiator. Specific examples of the oxime compound having a fluorine atom include the compound described in JP2010-262028A, the compounds 24 and 36 to 40 described in JP2014-500852A, and the compound (C-3) described in JP2013-164471A. The contents thereof are incorporated in the present specification.

The photoradical polymerization initiator may be used alone, but it is also preferable to use two or more kinds thereof in combination. Specific examples thereof include combinations of DAROCUR 1173 and IRGACURE 907, DAROCUR 1173 and LUCIRIN TPO, DAROCUR 1173 and IRGACURE 819, DAROCUR 1173 and IRGACURE OXE 01, IRGACURE 907 and LUCIRIN TPO, and IRGACURE 907 and IRGACURE 819. By using such a combination, an exposure margin can be expanded.

A proportion of the photoradical polymerization initiator in the composition for forming a pattern according to the embodiment of the present invention is preferably 0.01% to 10% by mass, more preferably 0.1% to 5% by mass, and still more preferably 0.5% to 3% by mass. The composition for forming a pattern may contain only one kind or two or more kinds of the photopolymerization initiators. In a case where two or more kinds thereof are contained, the total amount thereof is preferably within the above range.

<<Release Agent>>

The composition for forming a pattern according to the embodiment of the present invention may contain a release agent.

A kind of the release agent used in the present invention is not particularly specified as long as the kind does not depart from the spirit of the present invention. The release agent is preferably an additive having a function of segregating at an interface with the mold to promote separation from the mold. The composition for forming a pattern according to the embodiment of the present invention preferably contains, as the release agent, at least one kind of (a) a surfactant, (b) a non-polymerizable compound (hereinafter, referred to as a "non-polymerizable compound having releasability" in some cases) which has a polyalkylene glycol structure having at least one hydroxyl group at a terminal or having an etherified hydroxyl group, or (c) a polymerizable compound having a fluorine atom.

In the present invention, the release agent preferably has a hydrophilic group in order to appropriately retain moisture in the composition for forming a pattern. Specific examples of the hydrophilic group include a polyalkylene glycol structure, a polyalkylene glycol ether structure, a polyalkylene glycol ester structure, a hydroxyl group, an amine structure, a phosphate group, a sulfonyl group, a sulfate group, and a thiol group. Such a hydrophilic group more preferably has a polyalkylene glycol structure from the viewpoint of ensuring favorable releasability and an appropriate moisture content. Examples of the compound having such a hydrophilic group include the "non-polymerizable compound having releasability" which will be described later.

The release agent in the composition for forming a pattern may be of only one kind or two or more kinds. Moreover, in a case where the release agents are contained, a total content thereof with respect to the total solid content is preferably 0.1% to 20% by mass, more preferably 0.5% to 10% by mass, and still more preferably 1% to 5% by mass. In a case where two or more kinds of the release agents are used, the total amount thereof is preferably within the above range.

<<<(a) Surfactant>>>

As a surfactant for the release agent, a nonionic surfactant is preferable. Meanwhile, it is preferable that the surfactant is not a compound (for example, a silane coupling agent containing a chlorine atom, or the like) containing halogen atoms (in particular, a chlorine atom, a bromine atom, and an iodine atom) other than a fluorine atom.

The nonionic surfactant is a compound having at least one hydrophobic moiety and at least one nonionic hydrophilic moiety. The hydrophobic moiety and the nonionic hydrophilic moiety may each be at a terminal of a molecule, or inside. The hydrophobic moiety is constituted of a hydrophobic group selected from a hydrocarbon group, a fluorine-containing group, and a Si-containing group, and the number of carbon atoms in the hydrophobic moiety is preferably 1 to 25, more preferably 2 to 15, still more preferably 4 to 10, and even more preferably 5 to 8. The nonionic hydrophilic moiety preferably has at least one group selected from the group consisting of an alcoholic hydroxyl group, a phenolic hydroxyl group, an ether group (preferably, a polyoxyalkylene group and a cyclic ether group), an amide group, an imide group, a ureide group, a urethane group, a cyano group, a sulfonamide group, a lactone group, a lactam group, and a cyclocarbonate group. The nonionic surfactant may be a hydrocarbon-based, fluorine-based, Si-based, or fluorine and Si-based nonionic surfactant, but is more preferably a fluorine-based or Si-based nonionic surfactant and still more preferably a fluorine-based nonionic surfactant. Here, the "fluorine and Si-based surfactant" refers to a surfactant satisfying requirements of both a fluorine-based surfactant and a Si-based surfactant.

Examples of a commercially available product of the fluorine-based nonionic surfactant include FLUORAD FC-4430 and FC-4431 produced by Sumitomo 3M Limited, SURFLON S-241, S-242, S-243, and S-650 produced by AGC SEIMI CHEMICAL CO., LTD., EFTOP EF-PN31M-03, EF-PN31M-04, EF-PN31M-05, EF-PN31M-06, and MF-100 produced by Mitsubishi Materials Electronic Chemicals Co., Ltd., Polyfox PF-636, PF-6320, PF-656, and PF-6520 produced by OMNOVA Solutions Inc., FUTA-GENT 250, 251, 222F, and 212M DFX-18 produced by NEOS COMPANY LIMITED, UNIDYNE DS-401, DS-403, DS-406, DS-451, and DSN-403N produced by DAIKIN INDUSTRIES, LTD., MEGAFACE F-430, F-444, F-477, F-553, F-556, F-557, F-559, F-562, F-565, F-567, F-569, and R-40 produced by DIC Corporation, and Capstone FS-3100 and Zonyl FSO-100 produced by DuPont.

In a case where the composition for forming a pattern according to the embodiment of the present invention contains a surfactant, a content of the surfactant is preferably 0.1% to 10% by mass, more preferably 0.2% to 5% by mass, and still more preferably 0.5% to 5% by mass in the entire composition excluding a solvent. The composition for forming a pattern may contain only one kind or two or more kinds of the surfactants. In a case where two or more kinds thereof are contained, the total amount thereof is preferably within the above range.

<<<(b) Non-Polymerizable Compound Having Releasability>>>

In the composition for forming a pattern according to the embodiment of the present invention, the non-polymerizable compound having releasability is not particularly limited as long as the non-polymerizable compound has a polyalkylene glycol structure having at least one hydroxyl group at the terminal or having an etherified hydroxyl group, and it is preferable that a fluorine atom and a silicon atom are not substantially contained. Here, the non-polymerizable compound refers to a compound having no polymerizable group. Moreover, regarding the non-polymerizable compound, the expression "a fluorine atom and a silicon atom are not substantially contained" indicates, for example, that a total content ratio of the fluorine atom and the silicon atom is 1% by mass or less, and it is preferable that a fluorine atom and a silicon atom are not contained at all. In a case where a fluorine atom and a silicon atom are not contained, compatibility with the polymerizable compound is improved, and particularly in the composition for forming a pattern which does not substantially contain a solvent, coating uniformity, pattern formability during imprinting, and line edge roughness after dry etching are improved.

The polyalkylene glycol structure of the non-polymerizable compound having releasability is preferably a polyalkylene glycol structure including an alkylene group having 1 to 6 carbon atoms, more preferably a polyethylene glycol structure, a polypropylene glycol structure, a polybutylene glycol structure, or a mixed structure thereof, still more preferably a polyethylene glycol structure, a polypropylene glycol structure, or a mixed structure thereof, and even more preferably a polypropylene glycol structure.

Furthermore, the non-polymerizable compound may be substantially constituted of only a polyalkylene glycol structure, except for a substituent at a terminal. Here, the expression "substantially" means that constituent elements other than the polyalkylene glycol structure account for 5% by mass or less and preferably 1% by mass or less of the entire compound. It is particularly preferable to include a compound substantially consisting of a polypropylene glycol structure, as the non-polymerizable compound having releasability.

The number of alkylene glycol constitutional units included in the polyalkylene glycol structure is preferably 3 to 100, more preferably 4 to 50, still more preferably 5 to 30, and even more preferably 6 to 20.

The non-polymerizable compound having releasability preferably has at least one hydroxyl group at the terminal or has an etherified hydroxyl group. In a case where the non-polymerizable compound has at least one hydroxyl group at the terminal or has an etherified hydroxyl group, the remaining terminal may be a hydroxyl group, or a hydrogen atom of the terminal hydroxyl group may be substituted. As a group in which a hydrogen atom of the terminal hydroxyl group may be substituted, an alkyl group (that is, polyalkylene glycol alkyl ether) and an acyl group (that is, polyalkylene glycol ester) are preferable. A compound having a plurality of (preferably, two or three) polyalkylene glycol chains via a linking group can also be preferably used.

Preferred specific examples of the non-polymerizable compound having releasability include polyethylene glycol, polypropylene glycol (for example, produced by FUJIFILM Wako Pure Chemical Corporation), mono or dimethyl ether thereof, mono or dibutyl ether, mono or dioctyl ether, mono or dicetyl ether, monostearate, monooleate, polyoxyethylene glyceryl ether, polyoxypropylene glyceryl ether, polyoxyethylene lauryl ether, and trimethyl ether thereof.

A weight-average molecular weight of the non-polymerizable compound having releasability is preferably 150 to 6,000, more preferably 200 to 3,000, still more preferably 250 to 2,000, and even more preferably 300 to 1,200.

In addition, examples of a commercially available product of the non-polymerizable compound having releasability, which can be used in the present invention, include OLFINE E1010 (produced by Nissin Chemical Co., Ltd.) and Brij35 (produced by Kishida Chemical Co., Ltd.).

In a case where the composition for forming a pattern according to the embodiment of the present invention contains the non-polymerizable compound having releasability, a content of the non-polymerizable compound having releasability is preferably 0.1% by mass or greater, more preferably 0.5% by mass or greater, still more preferably 1.0% by mass or greater, and even more preferably 2% by mass or greater, in the total solid content. Moreover, the content is preferably 20% by mass or less, more preferably 10% by mass or less, and still more preferably 5% by mass or less.

The composition for forming a pattern may contain only one kind or two or more kinds of the non-polymerizable compounds having releasability. In a case where two or more kinds thereof are contained, the total amount thereof is preferably within the above range.

<<<(c) Polymerizable Compound Having Fluorine Atom>>>

The polymerizable compound having a fluorine atom as the release agent in the present invention preferably has a polymerizable group, and a functional group containing a fluorine atom.

The kind of the polymerizable group is not particularly limited, but, for example, an ethylenically unsaturated bond-containing group, an epoxy group, and the like are preferable, and an ethylenically unsaturated bond-containing group is more preferable. As described above, as the ethylenically unsaturated bond-containing group, for example, a vinyl group, an ethynyl group, a (meth)acryloyl group, a (meth)acryloyloxy group, and the like are preferable, a (meth)acryloyl group and a (meth)acryloyloxy group are more preferable, and an acryloyl group and an acryloyloxy group are still more preferable.

As the functional group containing a fluorine atom, a fluorine-containing group selected from a fluoroalkyl group and a fluoroalkyl ether group is preferable.

The fluoroalkyl group is preferably a fluoroalkyl group having 2 or more carbon atoms and more preferably a fluoroalkyl group having 4 or more carbon atoms, and the upper limit value of the number of carbon atoms is not particularly specified, but is preferably 20 or less, more preferably 8 or less, and still more preferably 6 or less. The fluoroalkyl group is most preferably a fluoroalkyl group having 4 to 6 carbon atoms. Specifically, the fluoroalkyl group is preferably a trifluoromethyl group, a pentafluoroethyl group, a heptafluoropropyl group, a hexafluoroisopropyl group, a nonafluorobutyl group, a tridecafluorohexyl group, or a heptadecafluorooctyl group. Moreover, it is also preferable that the fluoroalkyl group has a trifluoromethyl group at a terminal or a side chain.

The fluoroalkyl ether group preferably contains, for example, a perfluoroethyleneoxy group or a perfluoropropyleneoxy group. Moreover, similarly to the fluoroalkyl group, it is also preferable that the fluoroalkyl ether group has a trifluoromethyl group at the terminal, or has a trifluoromethyl group at the side chain as in —(CF(CF$_3$)CF$_2$O)—.

The polymerizable compound having a fluorine atom is also described in paragraphs 0021 to 0043 of JP2011-124554A, the contents of which are incorporated in the present specification.

In a case where the composition for forming a pattern according to the embodiment of the present invention contains the polymerizable compound having a fluorine atom, a content of the polymerizable compound having a fluorine atom is preferably 0.1% by mass or greater, more preferably 0.5% by mass or greater, still more preferably 1.0% by mass or greater, and even more preferably 2% by mass or greater, in the total solid content. Moreover, the content is preferably 20% by mass or less, more preferably 10% by mass or less, and still more preferably 5% by mass or less. The composition for forming a pattern may contain only one kind or two or more kinds of the polymerizable compounds having a fluorine atom. In a case where two or more kinds thereof are contained, the total amount thereof is preferably within the above range.

<<Other Components>>

The composition for forming a pattern according to the embodiment of the present invention may contain a sensitizer, an antioxidant, an ultraviolet absorber, a solvent, a polymer, or the like, in addition to the aforementioned components. Each of these compounds in the composition for forming a pattern may be of only one kind or two or more kinds. For the details thereof, reference can be made to the description in paragraphs 0061 to 0064 of JP2014-170949A, the contents of which are incorporated in the present specification.

Meanwhile, the composition for forming a pattern according to the embodiment of the present invention can also adopt an aspect in which a silane coupling agent is not contained. Consequently, it is possible to suppress that the silane coupling agent is bonded to the surface of the mold to increase an amount of attachments on the surface of the mold.

<<Solvent>>

The composition for forming a pattern according to the embodiment of the present invention may contain a solvent. Examples of the solvent include propylene glycol monomethyl ether acetate, cyclohexanone, 2-heptanone, γ-butyrolactone, propylene glycol monomethyl ether, and ethyl lactate. In a case where the solvent is contained, a content thereof is preferably 1% to 20% by mass with respect to the composition. Only one kind or two or more kinds of the solvents may be contained. In a case where two or more kinds thereof are contained, the total amount thereof is preferably within the above range.

Furthermore, in the present invention, a configuration in which a solvent other than water is not substantially contained can also be adopted. The expression "solvent is not substantially contained" means that the content of the solvent is 5% by mass or less, and the content is preferably 3% by mass or less and more preferably 1% by mass or less.

<<<Polymer>>>

The composition for forming a pattern according to the embodiment of the present invention may contain a polymer. The polymer is, for example, a component having a weight-average molecular weight of 2,000 or greater, and preferably a component having a weight-average molecular weight of greater than 2,000.

Furthermore, in the present invention, a configuration in which a polymer is not substantially contained can also be adopted. The expression "polymer is not substantially contained" means that the content of the polymer is 5% by mass or less, and the content is preferably 3% by mass or less and more preferably 1% by mass or less, with respect to the total solid content.

<Characteristics of Composition for Forming Pattern>

A viscosity of the composition for forming a pattern according to the embodiment of the present invention at 25° C. is preferably 12 mPa·s or lower, more preferably 11 mPa·s or lower, still more preferably 10 mPa·s or lower, even more preferably 9 mPa·s or lower, and further still more preferably 8 mPa·s or lower. The lower limit value of the viscosity is not particularly specified, but can be, for example, 5 mPa·s or higher. By setting the viscosity within the above range, the composition for forming a pattern according to the embodiment of the present invention is more likely to enter into the mold, and thus mold filling time can be shortened. Moreover, the pattern formability and the throughput can also be further improved.

An Ohnishi parameter of the composition for forming a pattern according to the embodiment of the present invention is preferably 4.0 or less, more preferably 3.9 or less, still more preferably 3.8 or less, even more preferably 3.6 or less, and particularly preferably 3.5 or less. The lower limit value of the Ohnishi parameter is not particularly specified, but can be, for example, 2.8 or greater. By setting the Ohnishi parameter to 4.0 or less, etching processing characteristics, in particular, pattern disconnection after etching can be further effectively suppressed.

<Method for Producing Composition for Forming Pattern>

The composition for forming a pattern according to the embodiment of the present invention is prepared by formulating raw materials (the respective materials described above) in a predetermined ratio. It is preferable that the raw materials are mixed and then the mixture is subjected to a filtration treatment with a filter. The filtration with a filter is preferably performed after the raw materials of the composition for forming a pattern are mixed.

Effects of filtration are exhibited even with one stage of a filter, but filtration with two or more stages of filters is more preferable. The filtration with two or more stages of filters refers to filtration in a state where two or more filters are arranged in series. In the present invention, filtration with one to four stages of filters is preferable, and filtration with two to four stages of filters is more preferable.

A component (material component) constituting the material for the filter preferably includes a resin. The resin is not particularly limited, and resins well-known as the material for the filter can be used. As one preferred embodiment of the component (material component) constituting the material for the filter, a polymer (grafted polymer) in which at least one kind of neutral groups is grafted can be mentioned. The neutral group is preferably at least one kind selected from a hydroxyl group or a carboxy group, and more preferably a hydroxyl group. The grafted polymer is preferably a grafted polyolefin and more preferably a grafted polyethylene. For the description of the grafted polymer, reference can be made to the description in WO2016/081729A, the contents of which are incorporated in the present specification.

A pore diameter of the filter used in the present invention is preferably 100 nm or smaller, more preferably 20 nm or smaller, still more preferably 12 nm or smaller, and even more preferably 8 nm or smaller, and may be 5 nm or smaller. By setting the pore diameter of the filter to 100 nm or smaller, impurities can be further effectively reduced. Moreover, the lower limit value of the pore diameter of the filter is not particularly specified, but is, for example, preferably 1 nm or larger. By setting the pore diameter of the filter to 1 nm or larger, an unnecessarily large pressure is not applied during filtration, productivity is improved, and breakage of a filter can be effectively suppressed. In a case where the filtration is performed stepwise, a filter having a pore diameter of 100 to 7 nm (preferably, a filter having a pore diameter of 20 to 7 nm) can be used in first-stage filtration, and a filter having a pore diameter of smaller than 7 nm (preferably, a filter having a pore diameter of smaller than 7 nm and 1 nm or larger) can be used in second-stage filtration. Moreover, a difference in the pore diameter from the immediately preceding stage, such as between the first stage and the second stage and between the second stage and the third stage, is preferably 1 to 8 nm.

<Storage Container>

As a storage container of the composition for forming a pattern according to the embodiment of the present invention, a storage container well-known in the related art can be used. Moreover, as the storage container, for the purpose of suppressing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-12335TA.

<Pattern Producing Method>

The composition for forming a pattern according to the embodiment of the present invention is used as a cured substance. More specifically, the composition for forming a pattern according to the embodiment of the present invention is used for producing a patterned cured substance (hereinafter, also simply referred to as a "pattern") by an optical imprinting method.

A pattern producing method according to the embodiment of the present invention includes applying the composition for forming a pattern according to the embodiment of the present invention onto a substrate or a mold and irradiating the composition for forming a pattern with light in a state where the composition for forming a pattern is sandwiched between the mold and the substrate. The method for applying the composition for forming a pattern onto the substrate or the mold is not particularly limited. Regarding the application method, reference can be made to the description in paragraph 0102 of JP2010-109092A (the corresponding US application is the specification of US2011/0199592A), the contents of which are incorporated in the present specification. In the present invention, as the application method, a spin coating method or an ink jet method is preferable.

In the present invention, the substrate is not particularly limited. Regarding the substrate, reference can be made to the description in paragraph 0103 of JP2010-109092A (the corresponding US application is the specification of US2011/0199592A), the contents of which are incorporated in the present specification. Specific examples thereof include a silicon substrate, a glass substrate, a sapphire substrate, a silicon carbide substrate, a gallium nitride substrate, a metal aluminum substrate, an amorphous aluminum oxide substrate, a polycrystalline aluminum oxide substrate, and a substrate made of GaAsP, GaP, AlGaAs, InGaN, GaN, AlGaN, ZnSe, AlGaInP, or ZnO. Furthermore, specific examples of a material for the glass substrate include aluminosilicate glass, aluminoborosilicate glass, and barium borosilicate glass. In the present invention, as the substrate, a silicon substrate is preferable.

In the present invention, the mold is not particularly limited. Regarding the mold, reference can be made to the description in paragraphs 0105 to 0109 of JP2010-109092A (the corresponding US application is the specification of US2011/0199592A), the contents of which are incorporated in the present specification. In the present invention, as the mold, a quartz mold is preferable. A pattern (line width) of the mold used in the present invention preferably has a size of 50 nm or less.

The composition for forming a pattern is irradiated with light in a state of being sandwiched between the mold and the substrate. A step of performing pressure contact with the substrate or the mold can be preferably performed under a rare gas atmosphere, under a reduced-pressure atmosphere, or under a pressure-reduced rare gas atmosphere. Here, the reduced-pressure atmosphere means a state in a space filled with a pressure lower than the atmospheric pressure (101, 325 Pa), and the pressure is preferably 1,000 Pa or lower, more preferably 100 Pa or lower, and still more preferably 1 Pa or lower. In a case where the rare gas is used, helium is preferable. An exposure amount is desirably in a range of 5 mJ/cm$^2$ to 1,000 mJ/cm$^2$.

Here, the composition for forming a pattern according to the embodiment of the present invention is preferably cured by further heating after light irradiation. Moreover, an underlayer film or a liquid film may be provided between the substrate and a layer formed of the composition for forming a pattern, by using a composition for forming an underlayer film or a composition for forming a liquid film. That is, the composition for forming a pattern (further, a pattern according to the embodiment of the present invention) may be provided directly on the surface of the substrate or the mold, or may be provided on the substrate or the mold via one or more layers. The underlayer film and the liquid film will be described in detail later.

In addition to the aforementioned matters, for details of the pattern producing method, reference can be made to the description in paragraphs 0103 to 0115 of JP2010-109092A (the corresponding US application is the specification of US2011/0199592A), the contents of which are incorporated in the present specification.

In the pattern producing method according to the embodiment of the present invention, a fine pattern can be formed at a low cost and with high accuracy by the optical imprinting method (more preferably, an optical nanoimprinting method). Therefore, the pattern, which was used to be formed by using the photolithography technique in the related art, can be formed with higher accuracy and at a lower cost. As an example, the method is used for manufacturing a semiconductor element. That is, the present invention also discloses a method for manufacturing a semiconductor element, which includes the pattern producing method according to the embodiment of the present invention. More specifically, the pattern according to the embodiment of the present invention is preferably used as an etching resist (etching mask). In particular, the pattern can also be applied as a permanent film, such as an overcoat layer or an insulating film, used in a liquid crystal display (LCD) or the like, or an etching resist such as a semiconductor integrated circuit, a recording material, or a flat panel display. In particular, the pattern obtained by the pattern producing method according to the embodiment of the present invention also has excellent etching resistance, and thus can also be preferably used as an etching resist for dry etching using fluorocarbon or the like.

<Pattern>

As described above, the pattern formed by the pattern producing method according to the embodiment of the present invention can be used as a permanent film used in an LCD or the like, or an etching resist for semiconductor processing. Moreover, a grid pattern is formed on a glass substrate of the LCD using the pattern according to the embodiment of the present invention, and thus a polarizing plate having low reflection or absorption and a large screen size (for example, 55 inches, or greater than 60 inches) can be manufactured at a low cost. For example, the polarizing plate described in JP2015-132825A or WO2011/132649A can be manufactured. Furthermore, 1 inch is 25.4 mm.

In addition, after the production, the composition for forming a pattern is bottled in a container such as a gallon bottle or a coated bottle, transported, and stored, but in this case, for the purpose of preventing deterioration, the inside of the container may be replaced with inert nitrogen, argon, or the like. Moreover, during the transportation and the storage, the temperature may be a normal temperature, but in order to further prevent degeneration of the composition for forming a pattern, the temperature may be controlled to be in a range of −20° C. to 0° C. It goes without saying that blocking light at a level at which the reaction does not proceed is preferable.

Specifically, the pattern according to the embodiment of the present invention can be preferably used for producing a recording medium such as a magnetic disc, a light-receiving element such as a solid-state imaging element, a light emitting element such as an LED and organic EL, an optical device such as an LCD, an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

The pattern formed by the pattern producing method according to the embodiment of the present invention is also useful as an etching resist (mask for lithography). In a case where the pattern is used as an etching resist, first, a silicon substrate (silicon wafer or the like) in which a thin film of $SiO_2$ or the like is formed or the like is used as a substrate, and a fine pattern of, for example, a nano or micro order is formed on the substrate by the pattern producing method according to the embodiment of the present invention. In the present invention, the pattern producing method is particularly advantageous in that a fine pattern of a nano order can be formed and a pattern having a size of 100 nm or less, further 50 nm or less, and particularly 30 nm or less can also be formed. The lower limit value of the size of the pattern formed by the pattern producing method according to the embodiment of the present invention is not particularly specified, but can be, for example, 1 nm or greater. A shape of the pattern is not particularly specified, but, for example, an aspect including at least one shape of a line, a hole, or a pillar is exemplified.

Thereafter, by performing etching with an etching gas such as hydrogen fluoride or the like in a case of wet etching and $CF_4$ or the like in a case of dry etching, a desired pattern can be formed on the substrate. The pattern has favorable etching resistance particularly to dry etching. That is, the pattern obtained by the producing method according to the embodiment of the present invention is preferably used as an etching mask. Moreover, the present invention also discloses a method for manufacturing a semiconductor element, in which etching is performed using, as a mask, the pattern obtained by the producing method according to the embodiment of the present invention.

<Composition for Forming Underlayer Film>

As described above, by providing the underlayer film between the substrate and the layer formed of the composition for forming a pattern, effects such as improvement in the adhesiveness between the substrate and the layer formed of the composition for forming a pattern can be achieved. In the present invention, the underlayer film can be obtained by applying the composition for forming an underlayer film onto the substrate and then curing the composition, in the same manner as the composition for forming a pattern. Hereinafter, each component of the composition for forming an underlayer film will be described.

The composition for forming an underlayer film of the present invention contains a curable component. The curable component is a component constituting the underlayer film, and may be any one of a high-molecular-weight component (for example, a molecular weight is greater than 1,000) or a low-molecular-weight component (for example, a molecular weight is less than 1,000). Specific examples thereof include a resin and a crosslinking agent. Each of these components may be used alone or in combination of two or more kinds thereof.

A total content of the curable components in the composition for forming an underlayer film is not particularly limited, but is preferably 50% by mass or greater in the total solid content, more preferably 70% by mass or greater in the total solid content, and still more preferably 80% by mass or greater in the total solid content. The upper limit thereof is not particularly limited, but is preferably 99.9% by mass or less.

A concentration of the curable component in the composition for forming an underlayer film (including a solvent) is not particularly limited, but is preferably 0.01% by mass or higher, more preferably 0.05% by mass or higher, and still more preferably 0.1% by mass or higher. The upper limit thereof is preferably 10% by mass or lower, more preferably 5% by mass or lower, still more preferably 1% by mass or lower, and even more preferably less than 1% by mass.

<<Resin>>

As the resin in the composition for forming an underlayer film, well-known resins can be widely used. The resin used in the present invention preferably has at least one of a radically polymerizable group or a polar group, and more preferably has both a radically polymerizable group and a polar group.

By having the radically polymerizable group, an underlayer film having excellent hardness can be obtained. Moreover, by having a polar group, adhesiveness to a substrate is improved. Furthermore, in a case where a crosslinking agent is formulated, a crosslinking structure formed after curing is further firmed, and thus hardness of the obtained underlayer film can be improved.

The radically polymerizable group preferably includes an ethylenically unsaturated bond-containing group. Examples of the ethylenically unsaturated bond-containing group include a (meth)acryloyl group (preferably a (meth)acryloyloxy group and a (meth)acryloylamino group), a vinyl group, a vinyloxy group, an allyl group, a methylallyl group, a propenyl group, a butenyl group, a vinylphenyl group, and a cyclohexenyl group, a (meth)acryloyl group and a vinyl group are preferable, a (meth)acryloyl group is more preferable, and a (meth)acryloyloxy group is still more preferable. The ethylenically unsaturated bond-containing group defined here is referred to as Et.

Furthermore, the polar group is preferably at least one kind of an acyloxy group, a carbamoyloxy group, a sulfonyloxy group, an acyl group, an alkoxycarbonyl group, an acylamino group, a carbamoyl group, an alkoxycarbonylamino group, a sulfonamide group, a phosphoric acid group, a carboxy group, or a hydroxyl group, more preferably at least one kind of an alcoholic hydroxyl group, a phenolic hydroxyl group, or a carboxy group, and still more preferably an alcoholic hydroxyl group or a carboxy group. The polar group defined here is referred to as a polar group Po. The polar group is preferably a nonionic group.

The resin in the composition for forming an underlayer film may further contain a cyclic ether group. Examples of the cyclic ether group include an epoxy group and an oxetanyl group, and an epoxy group is preferable. The cyclic ether group defined here is referred to as a cyclic ether group Cyt.

Examples of the resin include a (meth)acrylic resin, a vinyl resin, a novolac resin, a phenol resin, a melamine resin, a urea resin, an epoxy resin, and a polyimide resin, and at least one kind of a (meth)acrylic resin, a vinyl resin, or a novolac resin is preferable.

A weight-average molecular weight of the resin is preferably 4,000 or greater, more preferably 6,000 or greater, and still more preferably 8,000 or greater. The upper limit thereof is preferably 1,000,000 or less and may be 500,000 or less.

The resin preferably has at least one of constitutional units represented by Formulae (1) to (3).

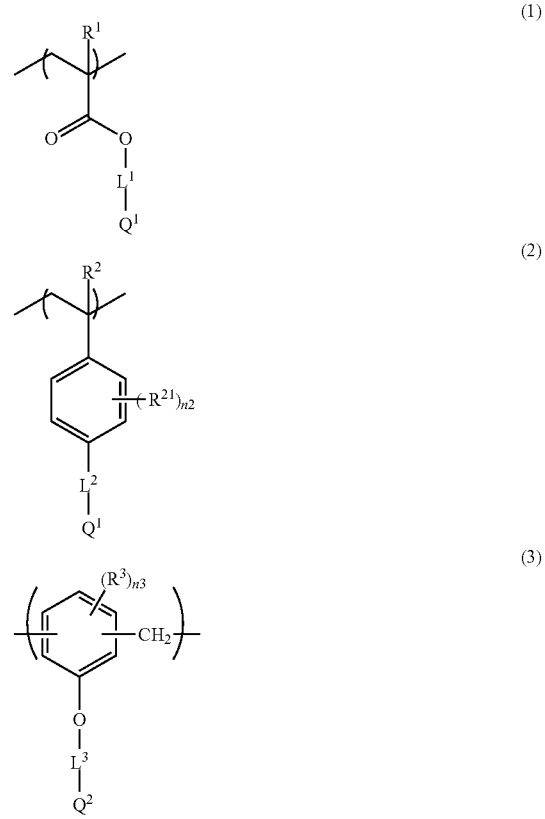

In the formulae, $R^1$ and $R^2$ are each independently a hydrogen atom or a methyl group. $R^{21}$ and $R^3$ are each independently a substituent. $L^1$, $L^2$, and $L^3$ are each independently a single bond or a linking group. n2 is an integer of 0 to 4. n3 is an integer of 0 to 3. $Q^1$ is an ethylenically unsaturated bond-containing group or a cyclic ether group. $Q^2$ is an ethylenically unsaturated bond-containing group, a cyclic ether group, or a polar group.

$R^1$ and $R^2$ are each preferably a methyl group.

$R^{21}$ and $R^3$ are each independently preferably the substituent T.

In a case where there are a plurality of $R^{21}$'s, $R^{21}$'s may be linked to each other to form a cyclic structure. In the present specification, the linking is meant to include not only an aspect in which groups are continued by bonding but also an aspect in which groups lose some atoms and are fused (condensed). Moreover, unless otherwise specified, an oxygen atom, a sulfur atom, and a nitrogen atom (amino group) may be included in the linking cyclic structure. Examples of the formed cyclic structure include an aliphatic hydrocarbon ring (groups exemplified below are referred to as a ring Cf) (for example, a cyclopropyl group, a cyclobutyl group, a cyclopentyl group, a cyclohexyl group, a cyclopropenyl group, a cyclobutenyl group, a cyclopentenyl group, a cyclohexenyl group, and the like), an aromatic hydrocarbon ring (rings exemplified below are referred to as a ring Cr) (a benzene ring, a naphthalene ring, an anthracene ring, a phenanthrene ring, and the like), a nitrogen-containing heterocyclic ring (rings exemplified below are referred to as a ring Cn) (for example, a pyrrole ring, an imidazole ring, a pyrazole ring, a pyridine ring, a pyrroline ring, a pyrrolidine ring, an imidazolidine ring, a pyrazolidine ring, a piperidine ring, a piperazine ring, a morpholine ring, and the like), an oxygen-containing heterocyclic ring (rings exemplified below are referred to as a ring Co) (a furan ring, a pyran ring, an oxirane ring, an oxetane ring, a tetrahydrofuran ring, a tetrahydropyran ring, a dioxane ring, and the like), and a sulfur-containing heterocyclic ring (rings exemplified below are referred to as a ring Cs) (a thiophene ring, a thiirane ring, a thietane ring, a tetrahydrothiophene ring, a tetrahydrothiopyran ring, and the like).

In a case where there are a plurality of $R^3$'s, $R^3$'s may be linked to each other to form a cyclic structure. Examples of the formed cyclic structure include the ring Cf, the ring Cr, the ring Cn, the ring Co, and the ring Cs.

It is preferable that $L^1$, $L^2$, and $L^3$ are each independently a single bond or a linking group L described later. Among them, a single bond, or an alkylene group or an (oligo) alkyleneoxy group, which is defined as the linking group L, is preferable, and an alkylene group is more preferable. The linking group L preferably has the polar group Po as a substituent. Moreover, an aspect in which the alkylene group has a hydroxyl group as a substituent is also preferable. In the present specification, the "(oligo)alkyleneoxy group" means a divalent linking group having one or more "alkyleneoxy" constitutional units. The number of carbon atoms in an alkylene chain in the constitutional unit may be the same or different for every constitutional unit.

n2 is preferably 0 or 1 and more preferably 0. n3 is preferably 0 or 1 and more preferably 0.

$Q^1$ is preferably the ethylenically unsaturated bond-containing group Et.

$Q^2$ is preferably a polar group, and more preferably an alkyl group having an alcoholic hydroxyl group.

The resin may further contain at least one of a constitutional unit (11), a constitutional unit (21), or a constitutional unit (31). In particular, in the resin included in the present invention, the constitutional unit (11) is preferably combined with the constitutional unit (1), the constitutional unit (21) is preferably combined with the constitutional unit (2), and the constitutional unit (31) is preferably combined with the constitutional unit (3).

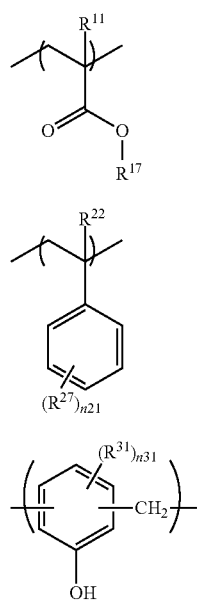

In the formulae, $R^{11}$ and $R^{22}$ are each independently a hydrogen atom or a methyl group. $R^{17}$ is a substituent. $R^{27}$ is a substituent. n21 is an integer of 0 to 5. $R^{31}$ is a substituent, and n31 is an integer of 0 to 3.

$R^{11}$ and $R^{22}$ are each preferably a methyl group.

$R^{17}$ is preferably a group containing a polar group or a group containing a cyclic ether group. In a case where $R^{17}$ is a group containing a polar group, $R^{17}$ is preferably a group containing the polar group Po, and more preferably the polar group Po or the substituent T substituted with the polar group Po. In a case where $R^{17}$ is a group containing a cyclic ether group, $R^{17}$ is preferably a group containing the cyclic ether group Cyt, and more preferably the substituent T substituted with the cyclic ether group Cyt.

$R^{27}$ is a substituent, and at least one of $R^{27}$'s is preferably a polar group. The substituent is preferably the substituent T. n21 is preferably 0 or 1 and more preferably 0. In a case where there are a plurality of $R^{27}$'s, $R^{27}$'s may be linked to each other to form a cyclic structure. Examples of the formed cyclic structure include examples of the ring Cf, the ring Cr, the ring Cn, the ring Co, and the ring Cs.

$R^{31}$ is preferably the substituent T. n31 is an integer of 0 to 3, preferably 0 or 1, and more preferably 0. In a case where there are a plurality of $R^{31}$'s, $R^{31}$'s may be linked to each other to form a cyclic structure. Examples of the formed cyclic structure include examples of the ring Cf, the ring Cr, the ring Cn, the ring Co, and the ring Cs.

Examples of the linking group L include an alkylene group (the number of carbon atoms is preferably 1 to 24, more preferably 1 to 12, and still more preferably 1 to 6), an alkenylene group (the number of carbon atoms is preferably 2 to 12, more preferably 2 to 6, and still more preferably 2 or 3), an (oligo)alkyleneoxy group (the number of carbon atoms in an alkylene group in one constitutional unit is preferably 1 to 12, more preferably 1 to 6, and still more preferably 1 to 3; and the repetition number is preferably 1 to 50, more preferably 1 to 40, and still more preferably 1 to 30), an arylene group (the number of carbon atoms is preferably 6 to 22, more preferably 6 to 18, and still more preferably 6 to 10), an oxygen atom, a sulfur atom, a sulfonyl group, a carbonyl group, a thiocarbonyl group, —$NR^N$—, and a linking group related to a combination thereof. The alkylene group, alkenylene group, and alkyleneoxy group may have the substituent T. For example, the alkylene group may have a hydroxyl group.

A linking chain length of the linking group L is preferably 1 to 24, more preferably 1 to 12, and still more preferably 1 to 6. The linking chain length means the number of atoms positioned on the shortest path among the atomic groups involved in the linkage. For example, in a case of —$CH_2$—(C=O)—O—, the linking chain length is 3.

Furthermore, the alkylene group, alkenylene group, and (oligo)alkyleneoxy group, which are defined as the linking group L, may be chain-like or cyclic, or may be linear or branched.

It is preferable that as an atom constituting the linking group L, a carbon atom, a hydrogen atom, and as necessary, a heteroatom (at least one kind selected from an oxygen atom, a nitrogen atom, or a sulfur atom, and the like) are included. The number of carbon atoms in the linking group is preferably 1 to 24, more preferably 1 to 12, and still more preferably 1 to 6. The number of hydrogen atom may be determined according to the number of carbon atoms and the like. In a case of the number of heteroatoms, the numbers of the oxygen atoms, the nitrogen atoms, and the sulfur atoms are each independently preferably 0 to 12, more preferably 0 to 6, and still more preferably 0 to 3.

The resin may be synthesized by a conventional method. For example, a resin having the constitutional unit represented by Formula (1) can be appropriately synthesized by a well-known method for addition polymerization of olefin. A resin having the constitutional unit represented by Formula (2) can be appropriately synthesized by a well-known method for addition polymerization of styrene. A resin having the constitutional unit represented by Formula (3) can be appropriately synthesized by a well-known method for synthesis of a phenol resin.

The resin may be used alone or in combination of a plurality thereof.

As the resin as the curable component, in addition to the aforementioned resins, the resins described in paragraphs 0016 to 0079 of WO2016/152600A, paragraphs 0025 to 0078 of WO2016/148095A, paragraphs 0015 to 0077 of WO2016/031879A, and paragraphs 0015 to 0057 of WO2016/027843A can be used, the contents of which are incorporated in the present specification.

<<Crosslinking Agent>>

The crosslinking agent in the composition for forming an underlayer film is not particularly limited as long as the crosslinking agent advances curing by a crosslinking reaction. In the present invention, the crosslinking agent is preferably reacted with a polar group of a resin to form a crosslinking structure. By using such a crosslinking agent, the resin is more firmly bonded, and thus a firmer film can be obtained.

Examples of the crosslinking agent include an epoxy compound (compound having an epoxy group), an oxetanyl compound (compound having an oxetanyl group), an alkoxymethyl compound (compound having an alkoxymethyl group), a methylol compound (compound having a methylol group), and a blocked isocyanate compound (compound having a blocked isocyanate group), and an alkoxymethyl compound (compound having an alkoxymethyl group) can form a firm bond at a low temperature and thus is preferable.

<<Other Components>>

The composition for forming an underlayer film of the present invention may contain other components in addition to the aforementioned components.

Specifically, one or more kinds of a solvent, a thermal acid generator, an alkylene glycol compound, a polymerization initiator, a polymerization inhibitor, an antioxidant, a leveling agent, a thickener, a surfactant, or the like may be contained. Regarding the aforementioned components, the respective components described in JP2013-036027A, JP2014-090133A, and JP2013-189537A can be used. Also regarding the content or the like, reference can be made to the description in the aforementioned publications.

<<Solvent>>

In the present invention, the composition for forming an underlayer film particularly preferably contains a solvent (hereinafter, also referred to as a "solvent for an underlayer film"). For example, the solvent is preferably a compound which is liquid at 23° C. and has a boiling point of 250° C. or lower. A content of the solvent for an underlayer film in the composition for forming an underlayer film is preferably 99.0% by mass or greater and more preferably 99.2% by mass or greater, and may be 99.4% by mass or greater. That is, the concentration of the total solid content in the composition for forming an underlayer film is preferably 1% by mass or lower, more preferably 0.8% by mass or lower, and still more preferably 0.6% by mass or lower. Moreover, the lower limit value thereof is preferably higher than 0% by mass, more preferably 0.001% by mass or higher, still more preferably 0.01% by mass or higher, and even more preferably 0.1% by mass or higher. By setting the proportion of the solvent within the above range, a film thickness during film formation is kept thin, and thus pattern formability during etching processing tends to be improved.

Only one kind or two or more kinds of the solvents may be contained in the composition for forming an underlayer film. In a case where two or more kinds thereof are contained, the total amount thereof is preferably within the above range.

A boiling point of the solvent for an underlayer film is preferably 230° C. or lower, more preferably 200° C. or lower, still more preferably 180° C. or lower, even more preferably 160° C. or lower, and further still more preferably 130° C. or lower. The lower limit value thereof is practically 23° C. but more practically 60° C. or higher. By setting the boiling point within the above range, the solvent can be easily removed from the underlayer film, which is preferable.

The solvent for an underlayer film is preferably an organic solvent. The solvent is preferably a solvent having any one or more of an ester group, a carbonyl group, a hydroxyl group, or an ether group. Among them, it is preferable to use an aprotic polar solvent.

Examples of a preferred solvent among the solvents for an underlayer film include alkoxy alcohol, propylene glycol monoalkyl ether carboxylate, propylene glycol monoalkyl ether, lactate, acetate, alkoxypropionate, chain-like ketone, cyclic ketone, lactone, and alkylene carbonate, and propylene glycol monoalkyl ether and lactone are particularly preferable.

<<<Thermal Acid Generator>>>

The thermal acid generator is a compound which generates an acid by heating and advances crosslinking by the action of the acid. In a case of being used in combination with the crosslinking agent, an underlayer film having higher hardness can be obtained.

As the thermal acid generator, an organic onium salt compound in which a cationic component and an anionic component are paired is usually used. As the cationic component, for example, organic sulfonium, organic oxonium, organic ammonium, organic phosphonium, and organic iodonium can be mentioned. Moreover, as the anionic component, for example, $BF_4^-$, $B(C_6F_5)_4^-$, $SbF_6^-$, $AsF_6^-$, $PF_6^-$, $CF_3SO_3^-$, $C_4F_9SO_3^-$, and $(CF_3SO_2)_3C^-$ can be mentioned.

Specifically, reference can be made to the description in paragraphs 0243 to 0256 of JP2017-224660A and paragraph 0016 of JP2017-155091A, the contents of which are incorporated in the present specification.

A content of the thermal acid generator is preferably 0.01 to 10 parts by mass and more preferably 0.1 to 5 parts by mass, with respect to 100 parts by mass of the crosslinking agent. The thermal acid generator may be used alone or in combination of two or more kinds thereof. In a case where two or more kinds thereof are used, the total amount thereof is preferably within the above range.

<<<Polymerization Initiator>>>

The composition for forming an underlayer film may contain a polymerization initiator and preferably contains at least one kind of a thermal polymerization initiator or a photopolymerization initiator. By containing the polymerization initiator, a reaction of a polymerizable group contained in the composition for forming an underlayer film is promoted, and thus the adhesiveness tends to be improved. From the viewpoint that crosslinking reactivity with the composition for forming a pattern is improved, a photopolymerization initiator is preferable. As the photopolymerization initiator, a radical polymerization initiator and a cationic polymerization initiator are preferable, and a radical polymerization initiator is more preferable. Moreover, in the present invention, a plurality of kinds of photopolymerization initiators may be used in combination.

As a photoradical polymerization initiator, well-known compounds can be optionally used. Examples thereof include a halogenated hydrocarbon derivative (for example, a compound having a triazine skeleton, a compound having an oxadiazole skeleton, a compound having a trihalomethyl group, and the like), an acylphosphine compound such as acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex. For the details thereof, reference can be made to the description in paragraphs 0165 to 0182 of JP2016-027357A, the contents of which are incorporated in the present specification.

Examples of the acylphosphine compound include 2,4,6-trimethylbenzoyl-diphenyl-phosphine oxide. Moreover, IRGACURE-819, IRGACURE 1173, and IRGACURE-TPO (trade names: all are produced by BASF SE), which are commercially available products, can be used.

In a case where the photopolymerization initiator used in the composition for forming an underlayer film is formulated, a content thereof in the total solid content is, for example, 0.0001% to 5% by mass, preferably 0.0005% to 3% by mass, and more preferably 0.01% to 1% by mass. In a case where two or more kinds of photopolymerization initiators are used, the total amount thereof is within the above range.

<Composition for Forming Liquid Film>

In addition, in the present invention, it is also preferable that a liquid film is formed on the underlayer film by using a composition for forming a liquid film containing a radically polymerizable compound which is a liquid at 23° C. and 1 atm. In the present invention, the liquid film can be obtained by applying the composition for forming a liquid film onto the substrate and then drying the composition, in the same manner as the composition for forming a pattern. By forming such a liquid film, there are effects that the adhesiveness between the substrate and the composition for forming a pattern is further improved, and that the wettability of the composition for forming a pattern on the substrate is also improved. Hereinafter, the composition for forming a liquid film will be described.

The viscosity of the composition for forming a liquid film is preferably 1,000 mPa·s or lower, more preferably 800 mPa·s or lower, still more preferably 500 mPa·s or lower, and even more preferably 100 mPa·s or lower. The lower limit value of the viscosity is not particularly limited, but can be, for example, 1 mPa·s or higher. The viscosity is measured according to the following method.

The viscosity is measured using an E-type rotational viscometer RE85L manufactured by TOKI SANGYO CO., LTD. and a standard cone rotor (1° 34'×R24) in a state where a temperature of a sample cup is adjusted to 23° C. The unit is mPa·s. Other details regarding the measurement are in accordance with JIS Z 8803:2011. Two samples are produced for one level and are respectively measured three times. An arithmetic mean value of a total of six times is adopted as an evaluation value.

<<Radically Polymerizable Compound A>>

The composition for forming a liquid film contains a radically polymerizable compound (radically polymerizable compound A) which is a liquid at 23° C. and 1 atm.

A viscosity of the radically polymerizable compound A at 23° C. is preferably 1 to 100,000 mPa·s. The lower limit thereof is preferably 5 mPa·s or higher and more preferably 11 mPa·s or higher. The upper limit thereof is preferably 1,000 mPa·s or lower and more preferably 600 mPa·s or lower.

The radically polymerizable compound A may be a monofunctional radically polymerizable compound having only one radically polymerizable group in one molecule, or a polyfunctional radically polymerizable compound having two or more radically polymerizable groups in one molecule. The monofunctional radically polymerizable compound and the polyfunctional radically polymerizable compound may be used in combination. Among them, for a reason of suppressing pattern collapse, the radically polymerizable compound A contained in the composition for forming a liquid film preferably includes a polyfunctional radically polymerizable compound, more preferably includes a radically polymerizable compound having two to five radically polymerizable groups in one molecule, still more preferably includes a radically polymerizable compound having two to four radically polymerizable groups in one molecule, and particularly preferably includes a radically polymerizable compound having two radically polymerizable groups in one molecule.

Furthermore, the radically polymerizable compound A preferably contains at least one of an aromatic ring (the number of carbon atoms is preferably 6 to 22, more preferably 6 to 18, and still more preferably 6 to 10) or an alicyclic ring (the number of carbon atoms is preferably 3 to 24, more preferably 3 to 18, and still more preferably 3 to 6), and more preferably contains an aromatic ring. The aromatic ring is preferably a benzene ring. Moreover, a molecular weight of the radically polymerizable compound A is preferably 100 to 900.

Examples of the radically polymerizable group of the radically polymerizable compound A include ethylenically unsaturated bond-containing groups, such as a vinyl group, an allyl group, and a (meth)acryloyl group, and a (meth)acryloyl group is preferable.

It is also preferable that the radically polymerizable compound A is a compound represented by Formula (I-1).

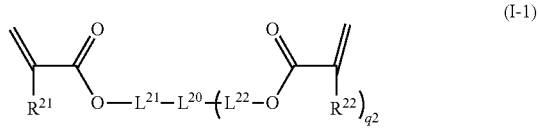

(I-1)

$L^{20}$ is a (1+q2)-valent linking group, and examples thereof include (1+q2)-valent linking groups which contains a group (the number of carbon atoms is preferably 1 to 12, more preferably 1 to 6, and still more preferably 1 to 3) having an alkane structure, a group (the number of carbon atoms is preferably 2 to 12, more preferably 2 to 6, and still more preferably 2 or 3) having an alkene structure, a group (the number of carbon atoms is preferably 6 to 22, more preferably 6 to 18, and still more preferably 6 to 10) having an aryl structure, a group (the number of carbon atoms is preferably 1 to 22, more preferably 1 to 18, and still more preferably 1 to 10, examples of a heteroatom include a nitrogen atom, a sulfur atom, and an oxygen atom, and a 5-membered ring, a 6-membered ring, and a 7-membered ring are preferable) having a heteroaryl structure, or a group obtained by combining these groups. Examples of the group in which two aryl groups are combined include groups having a structure such as biphenyl, diphenylalkane, biphenylene, and indene. Examples of a combination of the group having a heteroaryl structure and the group having an aryl structure include groups having a structure such as indole, benzimidazole, quinoxaline, and carbazole.

$L^{20}$ is preferably a linking group containing at least one kind selected from a group having an aryl structure or a group having a heteroaryl structure, and more preferably a linking group containing a group having an aryl structure.

$R^{21}$ and $R^{22}$ each independently represent a hydrogen atom or a methyl group.

$L^{21}$ and $L^{22}$ each independently represent a single bond or the linking group L, and a single bond or an alkylene group is preferable.

$L^{20}$ and $L^{21}$ or $L^{22}$ may be bonded to each other via or without via the linking group L to form a ring. $L^{20}$, $L^{21}$, and $L^{22}$ may have the substituent T. A plurality of substituents T may be bonded to each other to form a ring. In a case where there are the plurality of substituents T, the plurality of substituents T may be the same as or different from each other.

q2 is an integer of 0 to 5, preferably an integer of 0 to 3, more preferably an integer of 0 to 2, still more preferably 0 or 1, and particularly preferably 1.

As the radically polymerizable compound A, the compounds described in paragraphs 0017 to 0024 and Examples of JP2014-090133A, the compounds described in paragraphs 0024 to 0089 of JP2015-009171A, the compounds described in paragraphs 0023 to 0037 of JP2015-070145A, and the compounds described in paragraphs 0012 to 0039 of WO2016/152597A can also be used.

A content of the radically polymerizable compound A in the composition for forming a liquid film is preferably 0.01% by mass or greater, more preferably 0.05% by mass or greater, and still more preferably 0.1% by mass or greater. The upper limit thereof is preferably 10% by mass or less, more preferably 5% by mass or less, and still more preferably 1% by mass or less.

The content of the radically polymerizable compound A in the solid content of the composition for forming a liquid film is preferably 50% by mass or greater, more preferably 75% by mass or greater, and still more preferably 90% by mass or greater. The upper limit thereof may be 100% by mass. The radically polymerizable compound A may be used alone or in combination of two or more kinds thereof. In a case where two or more kinds thereof are used, the total amount thereof is preferably within the above range.

Furthermore, it is also preferable that the solid content of the composition for forming a liquid film substantially consists of the radically polymerizable compound A. The case where the solid content of the composition for forming a liquid film substantially consists of the radically polymerizable compound A means that the content of the radically polymerizable compound A in the solid content of the composition for forming a liquid film is 99.9% by mass or greater, the content is more preferably 99.99% by mass or greater, and it is still more preferable that the solid content consists of the radically polymerizable compound A.

<<Solvent>>

The composition for forming a liquid film preferably contains a solvent (hereinafter, referred to as a "solvent for a liquid film" in some cases). Examples of the solvent for a liquid film include the solvents described in the aforementioned section of the solvent for an underlayer film, and these solvents can be used. A content of the solvent for a liquid film in the composition for forming a liquid film is preferably 90% by mass or greater and more preferably 99% by mass or greater, and may be 99.99% by mass or greater.

A boiling point of the solvent for a liquid film is preferably 230° C. or lower, more preferably 200° C. or lower, still more preferably 180° C. or lower, even more preferably 160° C. or lower, and further still more preferably 130° C. or lower. The lower limit value thereof is practically 23° C. but more practically 60° C. or higher. By setting the boiling point within the above range, the solvent can be easily removed from the liquid film, which is preferable.

<<Radical Polymerization Initiator>>

The composition for forming a liquid film may contain a radical polymerization initiator. Examples of the radical polymerization initiator include a thermal radical polymerization initiator and a photoradical polymerization initiator, and a photoradical polymerization initiator is preferable. As a photoradical polymerization initiator, well-known compounds can be optionally used. Examples thereof include a halogenated hydrocarbon derivative (for example, a compound having a triazine skeleton, a compound having an oxadiazole skeleton, a compound having a trihalomethyl group, and the like), an acylphosphine compound, a hexaarylbiimidazole compound, an oxime compound, an organic peroxide, a thio compound, a ketone compound, an aromatic onium salt, an acetophenone compound, an azo compound, an azide compound, a metallocene compound, an organic boron compound, and an iron arene complex. For the details thereof, reference can be made to the description in paragraphs 0165 to 0182 of JP2016-027357A, the contents of which are incorporated in the present specification. Among them, an acetophenone compound, an acylphosphine compound, and an oxime compound are preferable. Examples of a commercially available product thereof include IRGACURE-OXE01, IRGACURE-OXE02, IRGACURE-127, IRGACURE-819, IRGACURE-379, IRGACURE-369, IRGACURE-754, IRGACURE-1800, IRGACURE-651, IRGACURE-907, IRGACURE-TPO, and IRGACURE-1173 (all produced by BASF SE), and Omnirad 184, Omnirad TPO H, Omnirad 819, and Omnirad 1173 (all produced by IGM Resins B.V).

In a case where the radical polymerization initiator is contained, the content thereof with respect to the solid content of the composition for forming a liquid film is preferably 0.1% to 10% by mass, more preferably 1% to 8% by mass, and still more preferably 2% to 5% by mass. In a case where two or more kinds of the radical polymerization initiators are used, the total amount thereof is preferably within the above range.

<<Other Components>>

The composition for forming a liquid film may contain one or more kinds of a polymerization inhibitor, an antioxidant, a leveling agent, a thickener, a surfactant, or the like, in addition to the aforementioned components.

<Kit>

A kit according to the embodiment of the present invention includes a combination of the composition for forming a pattern, which is for forming a pattern (cured film) for imprinting, and a composition for forming an underlayer film, which is for forming an underlayer film for imprinting. By using the kit according to the embodiment of the present invention, imprinting having excellent releasability can be performed. The composition for forming an underlayer film particularly preferably contains the resin having a radically polymerizable group, and an organic solvent. Furthermore, the kit according to the embodiment of the present invention preferably contains, as a component of a combination, a composition for forming a liquid film, which contains a polymerizable compound that is a liquid at 23° C. and 1 atm.

EXAMPLES

Hereinafter, the present invention will be described in more detail with reference to Examples. The materials, the used amounts, the ratios, the treatment details, the treatment procedures, and the like shown in the following Examples can be appropriately modified without departing from the spirit of the present invention. Therefore, the scope of the present invention is not limited to the specific examples described below. In Examples, unless otherwise specified, various treatments were performed in an environment of 23° C.

<Preparation of Composition for Forming Pattern>

For each Example and each Comparative Example, a composition was prepared by mixing the polymerizable compound, photopolymerization initiator, sensitizer, release agent, and organic halogen compound shown in the following tables in each of formulation ratios shown in the following tables, and further adding 4-hydroxy-2,2,6,6-tetramethylpiperidine-1-oxyl free radical (manufactured by Tokyo Chemical Industry Co., Ltd.) as a polymerization inhibitor so that the amount thereof was 100 to 300 ppm by mass (0.01% to 0.03% by mass) with respect to the polymerizable compound. Moreover, in order to adjust the content of moisture, ultrapure water (produced by FUJIFILM Wako Pure Chemical Corporation) was added to some of the compositions. Each of the compositions was filtered in multiple stages with a ultra-high-molecular-weight polyethylene (UPE)-made filter having a pore diameter of 0.02 μm, a nylon-made filter having a pore diameter of 0.005 μm, and a UPE-made filter having a pore diameter of 0.001 μm, to prepare a composition for forming a pattern for imprinting. Furthermore, the units of the formulation ratios of the polymerizable compound, photopolymerization initiator, release agent, and organic halogen compound in the tables are each parts by mass.

<Measurement of Concentration of Halide Ion>

A concentration of the halide ion was measured using ion chromatography. A specific method thereof is as follows. For each of Examples and Comparative Examples, 1 mL of the composition for forming a pattern was weighed, and dissolved in 6 mL of methyl isobutyl ketone (MIBK). Thereafter, 7 mL of Milli Q water was added, and liquid separation extraction was performed. Subsequently, an aqueous layer was taken out, filtration with a filter was performed, and then a total concentration of a chloride ion ($Cl^-$), a bromide ion ($Br^-$), and an iodide ion ($I^-$) was quantified using an ion chromatography system (IC-320 manufactured by Dionex Corporation) under the following conditions.

Column: IonPacAS11-HC
Eluent: KOH
Flow rate: 1.5 mL/min
Injection volume: 20 μL
Column temperature: 35° C.

<Measurement of Content of Moisture>

A content of moisture in each of the prepared compositions for forming a pattern was measured using a Karl Fischer moisture measuring device.

<Forced Aging (Accelerated Deterioration) Treatment of Composition for Forming Pattern, and Measurement of Acrylic Acid Decomposition Product>

A glass bottle (volume of 100 mL) subjected to a dealkalization treatment was filled with 100 mL of the composition for forming a pattern of each of Examples and Comparative Examples, and allowed to stand in a constant-temperature tank set to 60° C.±2° C. for 30 days, thereby forcibly aging each composition for forming a pattern.

An acrylic acid decomposition product generated by the forced aging was quantified using a liquid chromatography-mass spectrometry (LCC/MS) method. A specific method thereof is as follows. Methanol was added to the forcibly aged composition for forming a pattern to produce a 10% by mass solution, and the solution was injected through a PTFE filter with a size of 0.20 m into an LC/MS device under the following conditions. Moreover, an amount of the acrylic acid decomposition product was calculated from a peak surface area of a selected ion chromatogram in which negative ion SIM was 71.

Column: Mightysil RP-18GP
Eluent: 10 mM ammonium acetate-methanol solution/10 mM ammonium acetate aqueous solution
Flow rate: 0.2 mL/min
Injection volume: 2 μL

TABLE 1

|  | Example 1 | Example 2 | Example 3 | Example 4 | Example 5 | Example 6 | Example 7 | Example 8 |
|---|---|---|---|---|---|---|---|---|
| A-1 | 59 | 59 |  | 59 | 59 | 59 | 59 | 59 |
| A-2 |  | 20 |  |  |  |  |  |  |
| A-3 | 20 |  | 50 | 20 | 20 | 20 | 20 | 20 |
| A-4 |  |  |  |  |  |  |  |  |
| A-5 |  |  | 35 |  |  |  |  |  |
| A-6 |  |  | 8 |  |  |  |  |  |
| A-7 | 14 | 14 |  | 14 | 14 | 14 | 14 | 14 |
| A-8 |  |  |  |  |  |  |  |  |
| B-1 | 2 | 2 |  | 2 | 2 | 2 | 2 | 2 |
| B-2 |  |  | 2 |  |  |  |  |  |
| B-3 | 2 | 2 | 2 | 2 | 2 | 2 | 2 | 2 |
| B-4 |  |  |  |  |  |  |  |  |
| B-5 |  |  |  |  |  |  |  |  |
| C-1 |  | 2.998 |  |  |  |  |  |  |
| C-2 | 2.99 |  | 2.1 | 2.99 | 2.99 | 2.99 | 2.99 |  |
| C-3 |  |  |  |  |  |  |  | 2.99 |
| C-4 |  |  |  |  |  |  |  |  |
| C-5 |  |  |  |  |  |  |  |  |
| C-6 |  |  |  |  |  |  |  |  |

TABLE 1-continued

|  | Example 1 | Example 2 | Example 3 | Example 4 | Example 5 | Example 6 | Example 7 | Example 8 |
|---|---|---|---|---|---|---|---|---|
| D-1 | 0.01 | 0.002 |  |  |  | 0.01 | 0.01 |  |
| D-2 |  |  | 0.9 |  |  |  |  |  |
| D-3 |  |  |  |  |  |  |  |  |
| D-4 |  |  |  |  |  |  |  |  |
| D-5 |  |  |  | 0.01 |  |  |  |  |
| D-6 |  |  |  |  |  |  |  | 0.01 |
| D-7 |  |  |  |  |  |  |  |  |
| D-8 |  |  |  |  |  |  |  |  |
| D-9 |  |  |  |  | 0.01 |  |  |  |
| D-10 |  |  |  |  |  |  |  |  |
| PGMEA |  |  |  |  |  |  |  |  |
| Content of moisture [% by mass] | 0.05 | 0.01 | 0.7 | 0.03 | 0.3 | 0.009 | 1.1 | 0.05 |
| Concentration of halide ion [ppm by mass] | 30 | 0.11 | 1001 | 6 | 213 | 10 | 101 | 10 |
| Content of acrylic acid decomposition product [ppm by mass] | <10 | <10 | 40 | <10 | <10 | <10 | 110 | <10 |
| Evaluation of defects in case of using aged liquid | A | A | B | A | A | A | B | B |
| Evaluation of releasability in case of using aged liquid | A | B | A | B | A | B | A | B |
| Evaluation of corrosiveness to metal | A | A | B | A | B | A | B | A |

TABLE 2

|  | Example 9 | Example 10 | Example 11 | Example 12 | Example 13 | Example 14 | Example 15 | Example 16 |
|---|---|---|---|---|---|---|---|---|
| A-1 |  | 59 | 59 | 59 | 59 |  | 49 |  |
| A-2 | 38 |  |  |  |  |  |  | 45 |
| A-3 |  | 20 | 20 | 20 | 20 |  | 29 |  |
| A-4 | 38 |  |  |  |  |  |  |  |
| A-5 | 17 |  |  |  |  |  |  | 38 |
| A-6 |  |  |  |  |  |  |  | 10 |
| A-7 |  | 14 | 14 | 14 | 14 |  | 15 |  |
| A-8 |  |  |  |  |  | 3.6 |  |  |
| B-1 | 2 | 2 | 2 | 2 | 2 | 0.1 | 2 | 2 |
| B-2 |  |  |  |  |  |  |  |  |
| B-3 | 2 | 2 | 2 | 2 | 2 | 0.1 | 2 | 2 |
| B-4 |  |  |  |  |  |  |  |  |
| B-5 |  |  |  |  |  |  |  |  |
| C-1 |  | 2.95 |  |  |  | 0.199 | 2.99 |  |
| C-2 | 2.5 |  |  |  |  |  |  |  |
| C-3 |  |  | 2.99 |  |  |  |  |  |
| C-4 |  |  |  |  |  |  |  | 2.3 |
| C-5 |  |  |  | 2.99 |  |  |  |  |
| C-6 |  |  |  |  | 2.99 |  |  |  |
| D-1 |  |  |  | 0.01 | 0.01 | 0.001 | 0.01 | 0.7 |
| D-2 |  |  |  |  |  |  |  |  |
| D-3 |  |  |  |  |  |  |  |  |
| D-4 |  |  | 0.01 |  |  |  |  |  |
| D-5 |  |  |  |  |  |  |  |  |
| D-6 |  |  |  |  |  |  |  |  |
| D-7 | 0.5 |  |  |  |  |  |  |  |
| D-8 |  | 0.05 |  |  |  |  |  |  |
| D-9 |  |  |  |  |  |  |  |  |
| D-10 |  |  |  |  |  |  |  |  |
| PGMEA |  |  |  |  |  | 96 |  |  |
| Content of moisture [% by mass] | 0.1 | 0.03 | 0.05 | 0.01 | 0.01 | 0.03 | 0.03 | 0.003 |
| Concentration of halide ion [ppm by mass] | 10 | 5 | 15 | 0.1 | 0.1 | 0.005 | 10 | 99 |
| Content of acrylic acid decomposition product [ppm by mass] | <10 | <10 | <10 | <10 | <10 | <10 | <10 | <10 |

TABLE 2-continued

|  | Example 9 | Example 10 | Example 11 | Example 12 | Example 13 | Example 14 | Example 15 | Example 16 |
|---|---|---|---|---|---|---|---|---|
| Evaluation of defects in case of using aged liquid | B | B | A | A | A | A | A | A |
| Evaluation of releasability in case of using aged liquid | B | B | B | B | B | B | A | A |
| Evaluation of corrosiveness to metal | A | A | A | A | A | A | A | A |

TABLE 3

|  | Example 17 | Example 18 | Example 19 | Example 20 | Example 21 | Comparative Example 1 | Comparative Example 2 | Comparative Example 3 |
|---|---|---|---|---|---|---|---|---|
| A-1 | 50 |  | 59 | 60 | 59 | 59 | 59 | 59 |
| A-2 |  |  |  | 20 |  |  |  |  |
| A-3 | 29 | 45 | 20 |  | 20 | 20 | 20 | 20 |
| A-4 |  |  |  |  |  |  |  |  |
| A-5 |  | 38 |  |  |  |  |  |  |
| A-6 |  | 10 |  |  |  |  |  |  |
| A-7 | 14 |  | 14 | 14.5 | 14 | 14 | 14 | 14 |
| A-8 |  |  |  |  |  |  |  |  |
| B-1 | 2 |  | 2 | 4 |  | 2 |  | 2 |
| B-2 |  | 2 |  |  | 2 |  | 2 |  |
| B-3 | 1.99 | 1.5 | 2 |  | 2 | 2 | 2 | 2 |
| B-4 | 0.01 |  |  |  |  |  |  |  |
| B-5 |  | 0.5 |  |  |  |  |  |  |
| C-1 |  |  |  | 1.44 |  |  | 3 | 1.9 |
| C-2 | 2.995 |  |  |  | 2.8 | 3 |  |  |
| C-3 |  | 2.4 |  |  |  |  |  |  |
| C-4 |  |  | 2.6 |  |  |  |  |  |
| C-5 |  |  |  |  |  |  |  |  |
| C-6 |  |  |  |  |  |  |  |  |
| D-1 |  | 0.3 | 0.2 | 0.02 | 0.1 |  |  | 1.1 |
| D-2 | 0.005 | 0.3 |  | 0.02 |  |  |  |  |
| D-3 |  |  | 0.2 | 0.02 |  |  |  |  |
| D-4 |  |  |  |  |  |  |  |  |
| D-5 |  |  |  |  | 0.1 |  |  |  |
| D-6 |  |  |  |  |  |  |  |  |
| D-7 |  |  |  |  |  |  |  |  |
| D-8 |  |  |  |  |  |  |  |  |
| D-9 |  |  |  |  |  |  |  |  |
| D-10 |  |  |  |  |  |  |  |  |
| PGMEA |  |  |  |  |  |  |  |  |
| Content of moisture [% by mass] | 0.02 | 0.28 | 0.28 | 0.15 | 0.08 | 0.05 | 0.05 | 0.05 |
| Concentration of halide ion [ppm by mass] | 0.09 | 98 | 50 | 76 | 83 | 0.01 | 0.02 | 1069 |
| Content of acrylic acid decomposition product [ppm by mass] | <10 | <10 | <10 | <10 | <10 | <10 | <10 | <10 |
| Evaluation of defects in case of using aged liquid | A | A | A | A | A | B | B | B |
| Evaluation of releasability in case of using aged liquid | A | A | A | A | A | D | D | A |
| Evaluation of corrosiveness to metal | A | A | A | A | A | A | A | D |

TABLE 4

|  | Comparative Example 4 | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|
| A-1 | 59 | 50 |  | 50 |  | 50 | 59 | 59 |
| A-2 |  | 28 | 45 |  |  | 28 |  |  |

TABLE 4-continued

| | Comparative Example 4 | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|
| A-3 | 20 | | | 20 | | | 20 | 20 |
| A-4 | | | | | 76 | | | |
| A-5 | | 33 | | | | | | |
| A-6 | | | 15 | | | | | |
| A-7 | 14 | 15 | | 23 | 18 | 15 | 14 | 14 |
| A-8 | | | | | | | | |
| B-1 | 2 | 2 | 2 | | 2 | 2 | 2 | 2 |
| B-2 | | | | 2 | | | | |
| B-3 | 2 | 1.95 | 2 | 2 | 2 | 1.95 | 2 | 2 |
| B-4 | | 0.05 | | | | 0.05 | | |
| B-5 | | | | | | | | |
| C-1 | | | | | | | | |
| C-2 | | 2.9995 | | | | 2.9995 | 2.99 | 2.99 |
| C-3 | 1.8 | | 2.9995 | | | | | |
| C-4 | | | | 1.1 | 1.9995 | | | |
| C-5 | | | | | | | | |
| C-6 | | | | | | | | |
| D-1 | | | | | | | | |
| D-2 | | | | | | | | |
| D-3 | 1.2 | | | | | | | |
| D-4 | | | | | | | | |
| D-5 | | 0.0005 | | | | 0.0005 | | |
| D-6 | | | | 1.9 | | | | |
| D-7 | | | | | 0.0005 | | | |
| D-8 | | | 0.0005 | | | | | |
| D-9 | | | | | | | | |
| D-10 | | | | | | | 0.01 | 0.01 |
| PGMEA | | | | | | | | |
| Content of moisture [% by mass] | 0.1 | 0.05 | 0.08 | 0.1 | 0.13 | 1.1 | 0.05 | 1.1 |
| Concentration of halide ion [ppm by mass] | 1033 | 0.04 | 0.1 | 561 | 8 | 0.06 | 15 | 21 |
| Content of acrylic acid decomposition product [ppm by mass] | <10 | <10 | <10 | <10 | <10 | 100 | <10 | 95 |
| Evaluation of defects in case of using aged liquid | B | A | B | C | B | D | C | D |
| Evaluation of releasability in case of using aged liquid | A | D | C | A | D | D | D | D |
| Evaluation of corrosiveness to metal | D | A | A | C | A | B | A | A |

<Raw Material>

The specifications of respective raw materials are as follows.

<<<Polymerizable Compound>>>

A-1 to A-7: Compounds having the following structure.

A-8: Silicone acrylate resin synthesized from SILICONE RESIN X-40-9225 (produced by Shin-Etsu Chemical Co., Ltd.) and 2-hydroxyethyl acrylate. The weight-average molecular weight is 2,500, and the polymerizable group equivalent is 250.

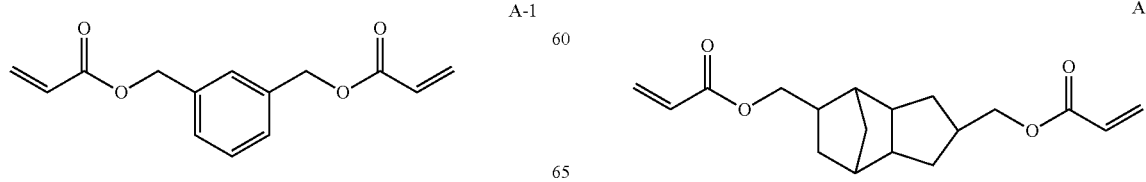

A-1

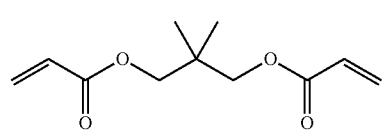

A-2

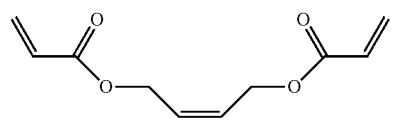

A-3

A-4

A-5
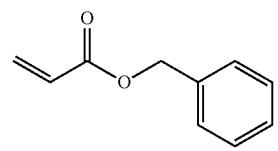

A-6
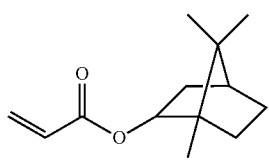

A-7
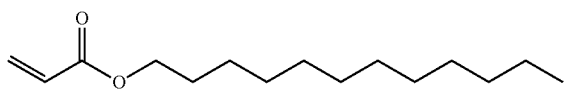

<<Photopolymerization Initiator or Sensitizer>>

B-1 to B-3: Compounds (photopolymerization initiators) having the following structure.

B-4 or B-5: Compound (sensitizer) having the following structure.

B-1
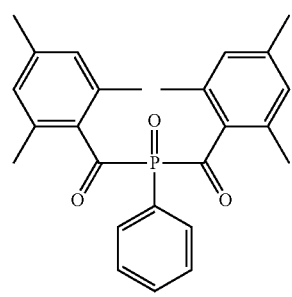

B-2
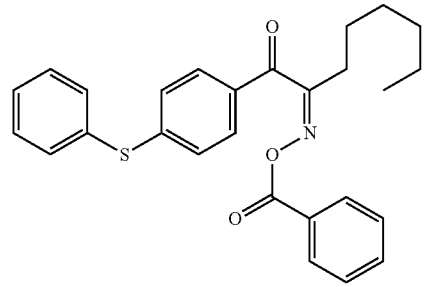

B-3
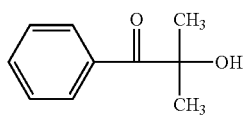

B-4
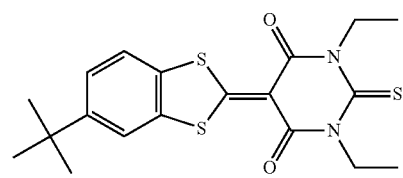

B-5
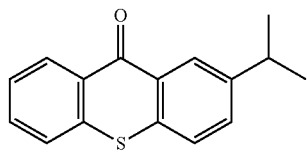

<<Release Agent>>

C-1 to C-6: Compounds having the following structure.

C-1
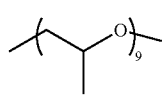

C-2
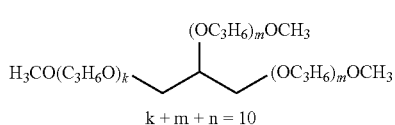

$k + m + n = 10$

C-3
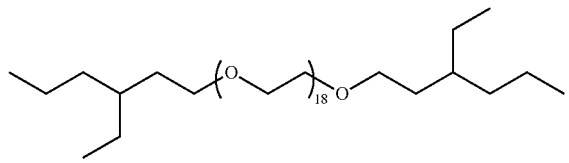

C-4
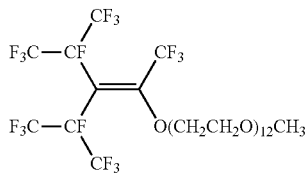

C-5
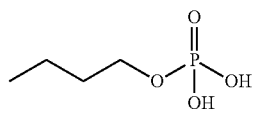

C-6
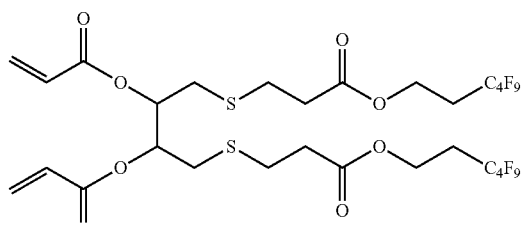

<<Organic Halogen Compound>>

D-1 to D-10: Compounds having the following structure.

D-1
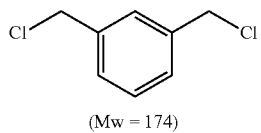

(Mw = 174)

-continued

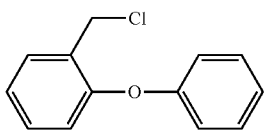
(Mw = 218)

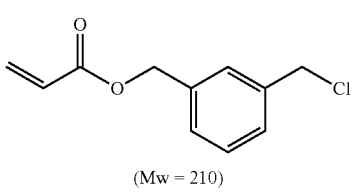
(Mw = 210)

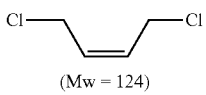
(Mw = 124)

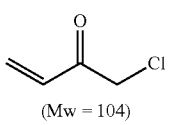
(Mw = 104)

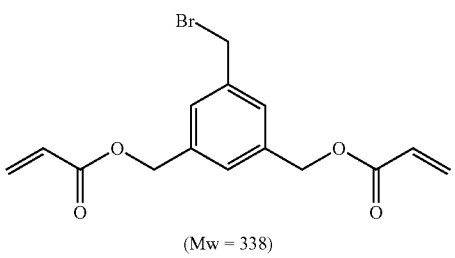
(Mw = 338)

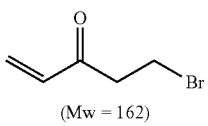
(Mw = 162)

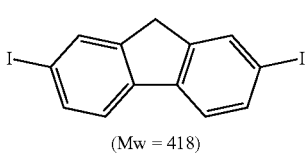
(Mw = 418)

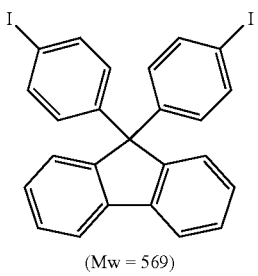
(Mw = 569)

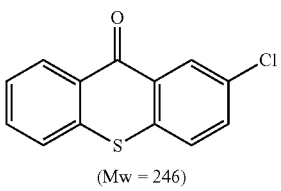
(Mw = 246)

<<Solvent>>

D-2  PGMEA: Propylene glycol monomethyl ether acetate

<Evaluation>

In order to evaluate the temporal stability of the composition for forming a pattern of each of Examples and Comparative Examples, first, as described above, each composition for forming a pattern was subjected to forced aging. Subsequently, each item of defects of a pattern formed by using the aged liquid, releasability of the aged liquid, and corrosiveness of the aged liquid to a metal was evaluated as follows. Moreover, considering these items comprehensively, the compositions for forming a pattern, which were not evaluated as C and D in all the items, were evaluated to have a little influence on a metal serving as a substrate of equipment for imprinting, and to have excellent temporal stability.

<<Evaluation of Defects in Case of Using Aged Liquid>>

A silicon wafer was spin-coated with the composition for forming a closely adhesive layer shown in Example 6 of JP2014-024322A, and heated for 1 minute using a hot plate at 220° C. to form a closely adhesive layer having a thickness of 5 nm. The composition for forming a pattern, which had been subjected to the forced aging, was applied onto the closely adhesive layer by the ink jet method using an ink jet device (INK JET PRINTER DMP-2831 manufactured by FUJIFILM Dimatix Inc.). Thereafter, a mold for imprinting was pressed against the composition for forming a pattern under a helium atmosphere. The used mold is a quartz mold with line and space having a line width of 30 nm, a depth of 75 nm, and a pitch of 60 nm. Subsequently, exposure was performed from the surface of the mold using an ultra-high pressure mercury lamp under a condition of an exposure amount of 100 mJ/cm$^2$, and the mold was released to obtain a pattern (hereinafter, referred to as a sample) consisting of a cured substance of the composition for forming a pattern. The series of steps from the application by ink jet to the release was repeated 20 times while changing places on the silicon wafer.

The 20$^{th}$ imprinted sample was introduced into a defect inspection device (KLA 2930, manufactured by KLA-Tencor Corporation), and the number of defects DD (defect density, unit: defects/cm$^2$) was checked. Moreover, the number of defects DD was evaluated according to the following standards.

A: DD<1 defect/cm$^2$
B: 1 defect/cm$^2$≤DD<50 defects/cm$^2$
C: 50 defects/cm$^2$≤DD<100 defects/cm$^2$
D: 100 defects/cm$^2$≤DD <<Evaluation of Releasability in Case of Using Aged Liquid>>

A silicon wafer was spin-coated with the composition for forming a closely adhesive layer shown in Example 6 of JP2014-024322A, and heated for 1 minute using a hot plate at 220° C. to form a closely adhesive layer having a thickness of 5 nm. The composition for forming a pattern, which had been subjected to the forced aging, was applied onto the closely adhesive layer by the ink jet method using an ink jet device (INK JET PRINTER DMP-2831 manufactured by FUJIFILM Dimatix Inc.). Thereafter, a mold for imprinting was pressed against the composition for forming a pattern under a helium atmosphere. The used mold is a quartz mold with line and space having a line width of 15 nm, a depth of 30 nm, and a pitch of 60 nm. Subsequently, exposure was performed from the surface of the mold using an ultra-high pressure mercury lamp under a condition of an exposure amount of 100 mJ/cm$^2$, and the mold was released to obtain a pattern consisting of a cured substance of the composition for forming a pattern. The series of steps from the application by ink jet to the release was repeated 20 times while changing places on the silicon wafer.

In the pattern formation, a force (releasing force F, unit: N) required to release the quartz mold was measured each time, and a rate of increase in the releasing force was calculated by the following expression. The releasing force was measured according to the method of Comparative Example described in paragraphs 0102 to 0107 of JP2011-206977A.

Rate of increase in releasing force=[average value of $15^{th}$ to $20^{th}$ releasing forces]/[average value of $1^{st}$ to $5^{th}$ releasing forces]

A: Rate of increase in releasing force≤5.0%
B: 5.0%<Rate of increase in releasing force≤10%
C: 10%<Rate of increase in releasing force≤20%
D: 20%<Rate of increase in releasing force <<Evaluation of Corrosiveness to Metal>>

A glass bottle (volume of 100 mL) subjected to a dealkalization treatment was filled with 100 mL of the composition for forming a pattern for imprinting, a stainless steel piece (SUS304) of 1 cm square was put in the glass bottle, and the resultant was allowed to stand in a constant-temperature tank set to 60° C.±2° C. for 30 days. Thereafter, the stainless steel piece was taken out, and washing with acetone was performed. A degree of corrosion of the washed stainless steel piece was checked with an optical microscope, and the corrosiveness to the metal was evaluated as follows according to the state thereof. The observation with an optical microscope was performed at 100 points in a visual field of 1,000 μm square.

A: The corrosion of the metal was not observed.
B: The corrosion of the metal was observed in a region of less than 1% of the surface of the metal.
C: The corrosion of the metal was observed in a region of 1% or greater and less than 5% of the surface of the metal.
D: The corrosion of the metal was observed in a region of 5% or greater of the surface of the metal.

<<Evaluation Result>>

The evaluation results of each item are shown in Tables 1 to 4. From these results, it was found that in a case where the composition for forming a pattern according to the embodiment of the present invention contains a predetermined organic halogen compound, the temporal stability is improved even in the imprinting in which the mold is repeatedly used.

In addition, a predetermined pattern corresponding to a semiconductor circuit was formed by using the composition for forming a pattern according to each of Examples. Moreover, each silicon wafer was dry-etched by using this pattern as an etching mask, and each semiconductor element was produced using this silicon wafer. There was no problem with the performance of any of the semiconductor elements.

What is claimed is:

1. A composition for forming a pattern for imprinting, comprising:
a polymerizable compound;
a photopolymerization initiator; and
an organic halogen compound containing at least one atom selected from the group consisting of a chlorine atom, a bromine atom, and an iodine atom,
wherein the polymerizable compound contains a partial structure obtained by removing a halogen atom from the organic halogen compound,
the organic halogen compound is a compound which is stable to light of a mercury lamp, and
a content of the organic halogen compound is 0.001% to 1.0% by mass with respect to a total solid content in the composition for forming a pattern,
wherein a solvent other than water is not substantially contained in the composition for forming a pattern, and the composition for forming a pattern has a viscosity at 25° C. of 12 mPa·s or lower.

2. The composition for forming a pattern according to claim 1, further comprising at least one halide ion selected from a chloride ion, a bromide ion, or an iodide ion, wherein a total content of the halide ions is 0.05 to 1,000 ppm by mass with respect to the total solid content of the composition for forming a pattern.

3. The composition for forming a pattern according to claim 1,
wherein a molecular weight of the organic halogen compound is 130 to 550.

4. The composition for forming a pattern according to claim 1, further comprising moisture in a proportion of 0.01% to 1.0% by mass with respect to the composition for forming a pattern.

5. The composition for forming a pattern according to claim 1,
wherein the organic halogen compound contains a chlorine atom.

6. The composition for forming a pattern according to claim 1,
wherein the at least one atom is bonded to an alkylene group in the organic halogen compound.

7. The composition for forming a pattern according to claim 6,
wherein the at least one atom is linked to a ring structure or an olefin structure via the alkylene group.

8. The composition for forming a pattern according to claim 1,
wherein the organic halogen compound has a ring structure.

9. The composition for forming a pattern according to claim 8,
wherein the organic halogen compound is represented by Formula (D1),

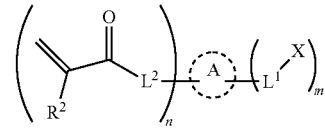

Formula (D1)

in Formula (D1), A represents a ring structure, $L^1$'s each independently represent a single bond or a divalent linking group connecting the ring structure A and X, X's each independently represent a chlorine atom, a bromine atom, or an iodine atom, m represents an integer of 1 to 4, $L^2$ represents a single bond or a divalent linking group connecting a carbon atom and the ring structure A, $R^2$ represents a hydrogen atom or a methyl group, and n represents an integer of 0 to 4.

10. The composition for forming a pattern according to claim 1,
wherein the polymerizable compound has a (meth)acryloyl group.

11. The composition for forming a pattern according to claim 1, further comprising a release agent having a hydrophilic group.

12. A kit comprising, as components of a combination:
   the composition for forming a pattern according to claim 1; and
   a composition for forming an underlayer film for imprinting.

13. A pattern which is formed of the composition for forming a pattern according to claim 1.

14. A pattern producing method comprising applying the composition for forming a pattern according to claim 1 onto a substrate, and irradiating the composition for forming a pattern with light in a state of being sandwiched between a mold and the substrate.

15. A method for manufacturing a semiconductor element, comprising:
   applying the composition for forming a pattern according to claim 1 onto a substrate;
   irradiating the composition for forming a pattern with light in a state of being sandwiched between a mold and the substrate to produce a pattern; and
   performing etching using, as a mask, the pattern.

* * * * *